US012562201B2

(12) United States Patent
Shim

(10) Patent No.: US 12,562,201 B2
(45) Date of Patent: Feb. 24, 2026

(54) ELECTRONIC DEVICE AND ELECTRONIC SYSTEM FOR PERFORMING PHASE ADJUSTMENT OPERATION

(71) Applicant: SK hynix Inc., Icheon-si (KR)

(72) Inventor: Jae Min Shim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 144 days.

(21) Appl. No.: 18/541,678

(22) Filed: Dec. 15, 2023

(65) Prior Publication Data

US 2025/0061932 A1　　Feb. 20, 2025

(30) Foreign Application Priority Data

Aug. 16, 2023　　(KR) ........................ 10-2023-0107234

(51) Int. Cl.
　　*G11C 8/18*　　　(2006.01)
　　*G11C 7/22*　　　(2006.01)
　　*H03L 7/085*　　(2006.01)
(52) U.S. Cl.
　　CPC .................. *G11C 8/18* (2013.01); *G11C 7/22* (2013.01); *G11C 7/222* (2013.01); *H03L 7/085* (2013.01)
(58) Field of Classification Search
　　CPC ....... G11C 8/18; G11C 11/4076; G11C 7/222; G11C 7/22; H03L 7/085; H03L 7/089; H03L 7/091; H03L 7/095; H03L 7/0814; H03L 7/097
　　See application file for complete search history.

(56) References Cited

U.S. PATENT DOCUMENTS

| | | | |
|---|---|---|---|
| 8,564,343 B2 | 10/2013 | Huang | |
| 2002/0171296 A1* | 11/2002 | Ishibashi | ............... H03L 7/0891 |
| | | | 307/100 |
| 2011/0227616 A1* | 9/2011 | Jang | ........................ H03L 7/095 |
| | | | 327/157 |
| 2020/0403622 A1* | 12/2020 | Ghotgalkar | ........... H03L 7/0891 |

FOREIGN PATENT DOCUMENTS

| | | |
|---|---|---|
| KR | 20180063396 A | 6/2018 |
| KR | 20220051497 A | 4/2022 |

\* cited by examiner

*Primary Examiner* — Jay W. Radke

(74) *Attorney, Agent, or Firm* — WILLIAM PARK AND ASSOCIATES LTD.

(57) ABSTRACT

An electronic device includes a phase detection circuit configured to detect a difference between the phases of a reference clock and a feedback clock and a phase-locked signal generation circuit configured to generate a phase-locked signal based on the results of the detection of the difference between the phases of the reference clock and the feedback clock. The phase-locked signal generation circuit is configured to generate the phase-locked signal when the difference between the phases of the reference clock and the feedback clock is equal to or smaller than a first phase difference after the start of an initial operation and configured to stop the generation of the phase-locked signal when the difference between the phases of the reference clock and the feedback clock is equal to or greater than a second phase difference, which is greater than the first phase difference, after outputting the phase-locked signal.

20 Claims, 21 Drawing Sheets

PUP

FS

PDN

323<1>

323<2>

323<3>

RST

FDET GEN 331

CDET GEN 332

LAT CT 333

UP
DN
RCLK
RCD<1:4>

FCD<1:4>

FDET

CDET

PLL_LK

| RCD<1:4> | Delay (ns) | |
| FCD<1:4> | 1st SET PERIOD | 2nd SET PERIOD |
|---|---|---|
| 0000 | 0.35 | 0.53 |
| 0001 | 0.70 | 1.05 |
| 0010 | 1.05 | 1.58 |
| 0011 | 1.40 | 2.11 |
| 0100 | 1.76 | 2.63 |
| 0101 | 2.11 | 3.16 |
| 0110 | 2.46 | 3.69 |
| 0111 | 2.81 | 4.22 |
| 1000 | 3.16 | 4.74 |
| 1001 | 3.51 | 5.27 |
| 1010 | 3.86 | 5.80 |
| 1011 | 4.21 | 6.32 |
| 1100 | 4.57 | 6.85 |
| 1101 | 4.92 | 7.38 |
| 1110 | 5.27 | 7.90 |
| 1111 | 5.62 | 8.43 |

ELECTRONIC DEVICE AND ELECTRONIC SYSTEM FOR PERFORMING PHASE ADJUSTMENT OPERATION

CROSS-REFERENCE TO RELATED APPLICATION

The present application claims priority under 35 U.S.C. § 119 (a) to Korean Patent Application No. 10-2023-0107234, filed in the Korean Intellectual Property Office on Aug. 16, 2023, the entire disclosure of which is incorporated herein by reference.

BACKGROUND

The present disclosure relates to an electronic device and electronic system for performing a phase adjustment operation, which adjust the phase of a phase-locked loop (PLL) clock by detecting a difference between the phases of a reference clock and a feedback clock during a set period.

In general, a semiconductor device including double data rate synchronous DRAM (DDR SDRAM) generates an internal clock signal by receiving a clock signal from an external device and uses the internal clock signal as a reference for synchronizing various types of operation timing within the semiconductor device. Accordingly, a circuit for generating the internal clock signal is included in the semiconductor device. Such a circuit includes a phase-locked loop (PLL) and a delay-locked loop (DLL) representatively.

SUMMARY

In an embodiment, an electronic device may include a phase detection circuit configured to detect a difference between the phases of a reference clock and a feedback clock and a phase-locked signal generation circuit configured to generate a phase-locked signal based on the results of the detection of the difference between the phases of the reference clock and the feedback clock. The phase-locked signal generation circuit is configured to generate the phase-locked signal when the difference between the phases of the reference clock and the feedback clock is equal to or smaller than a first phase difference after the start of an initial operation and configured to stop the generation of the phase-locked signal when the difference between the phases of the reference clock and the feedback clock is equal to or greater than a second phase difference, which is greater than the first phase difference, after outputting the phase-locked signal.

Furthermore, an electronic device may include an initial detection signal generation circuit configured to generate an initial detection signal when a difference between the phases of a reference clock and a feedback clock is equal to or smaller than a first phase difference after the start of an initial operation, an operation detection signal generation circuit configured to stop the generation of an operation detection signal when the difference between the phases of the reference clock and the feedback clock is equal to or greater than a second phase difference, which is greater than the first phase difference, after outputting a phase-locked signal, and a latch circuit configured to generate the phase-locked signal based on the initial detection signal and the operation detection signal.

Furthermore, a method of adjusting a phase may include an initial operation step of detecting a difference between the phases of a reference clock and a feedback clock and generating an initial detection signal for generating a phase-locked signal when the difference between the phases of the reference clock and the feedback clock is equal to or smaller than a first phase difference after the start of an initial operation, and a phase-locked signal control step of generating an operation detection signal for stopping the generation of the phase-locked signal when the difference between the phases of the reference clock and the feedback clock is equal to or greater than a second phase difference, which is greater than the first phase difference, after outputting the phase-locked signal.

BRIEF DESCRIPTION OF THE DRAWINGS

FIG. 4 is a block diagram illustrating a construction according to an embodiment of a phase detection circuit that is included in the PLL clock generation circuit illustrated in FIG. 3.

FIG. 5 is a circuit diagram illustrating a construction according to an embodiment of a reference clock phase control circuit that is included in the phase detection circuit illustrated in FIG. 4.

FIG. 6 is a circuit diagram illustrating a construction according to an embodiment of a feedback clock phase control circuit that is included in the phase detection circuit illustrated in FIG. 4.

FIG. 7 is a circuit diagram illustrating a construction according to an embodiment of a reset signal generation circuit that is included in the phase detection circuit illustrated in FIG. 4.

FIG. 10 is a block diagram illustrating a construction according to an embodiment of a phase-locked signal generation circuit that is included in the PLL clock generation circuit illustrated in FIG. 3.

FIG. 11 is a block diagram illustrating a construction according to an embodiment of an initial detection signal generation circuit that is included in the phase-locked signal generation circuit illustrated in FIG. 10.

FIG. 12 is a diagram illustrating a construction according to an embodiment of a setting signal generation circuit that is included in the initial detection signal generation circuit illustrated in FIG. 11.

FIG. 15 is a table for describing a first set period and a second set period based on compensation codes and offset codes according to an embodiment of the present disclosure.

Figure 10:
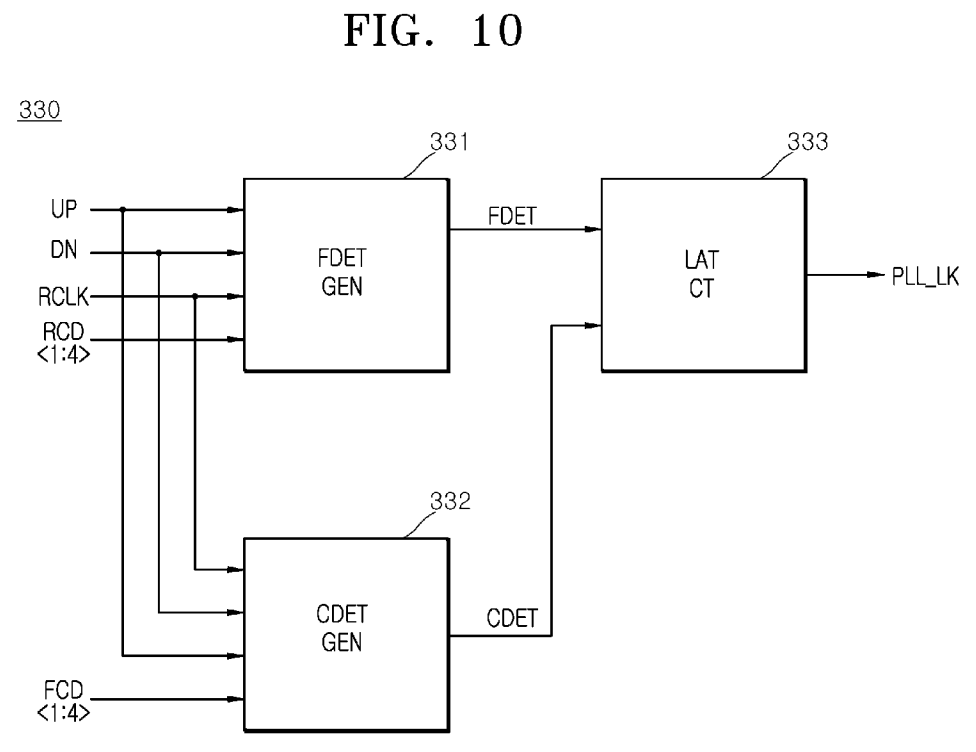
Figure 16:
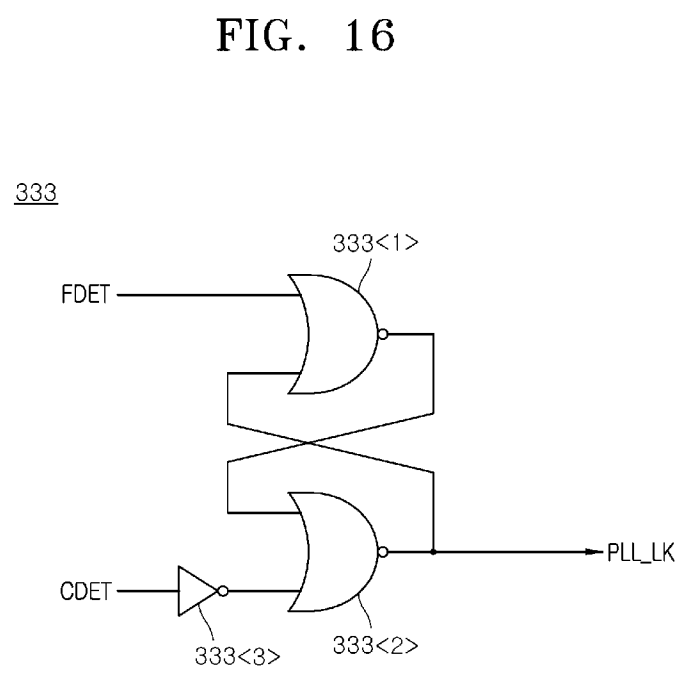

FIG. 16 is a circuit diagram illustrating a construction according to an embodiment of a latch circuit that is included in the phase-locked signal generation circuit illustrated in FIG. 10.

Figure 17:
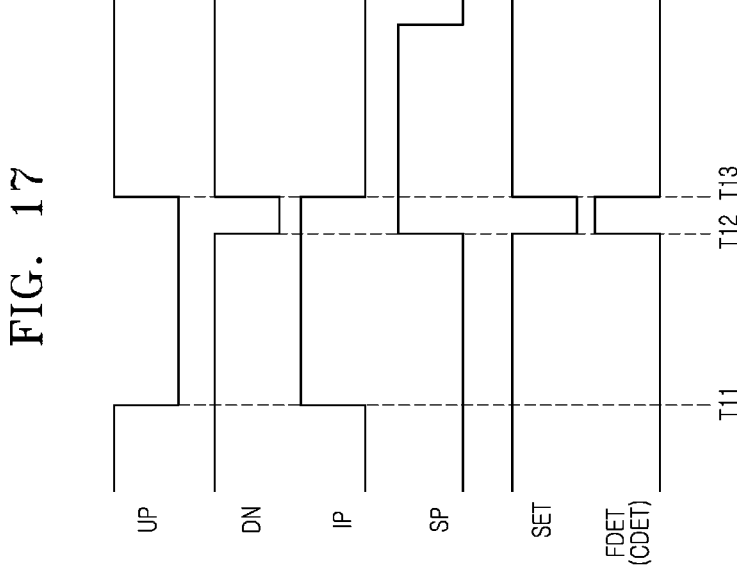
Figure 18:
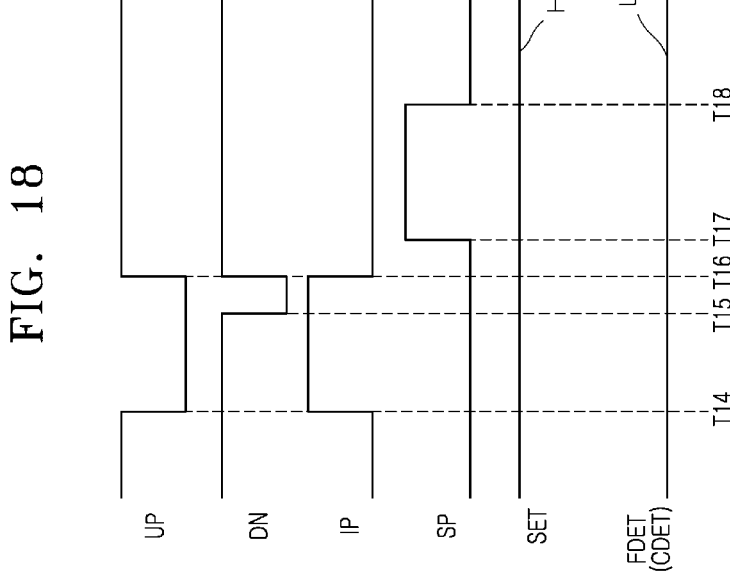

FIGS. 17 and 18 are timing diagrams for describing an operation of the initial detection signal generation circuit according to an embodiment of the present disclosure.

Figure 19:
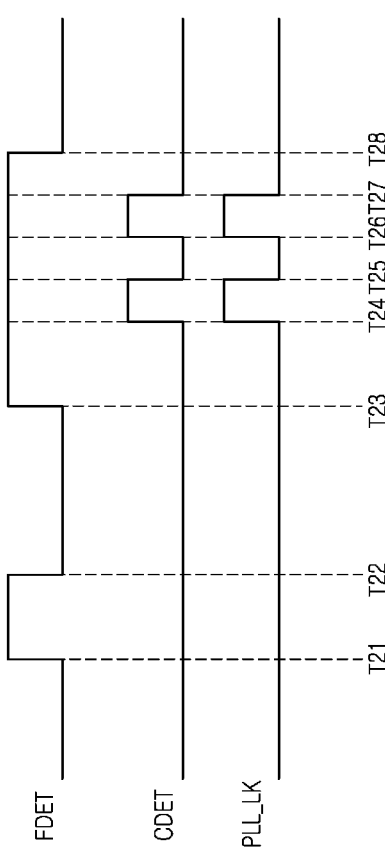

FIG. 19 is a timing diagram for describing an operation of a phase-locked signal generation circuit according to an embodiment of the present disclosure.

Figure 20:
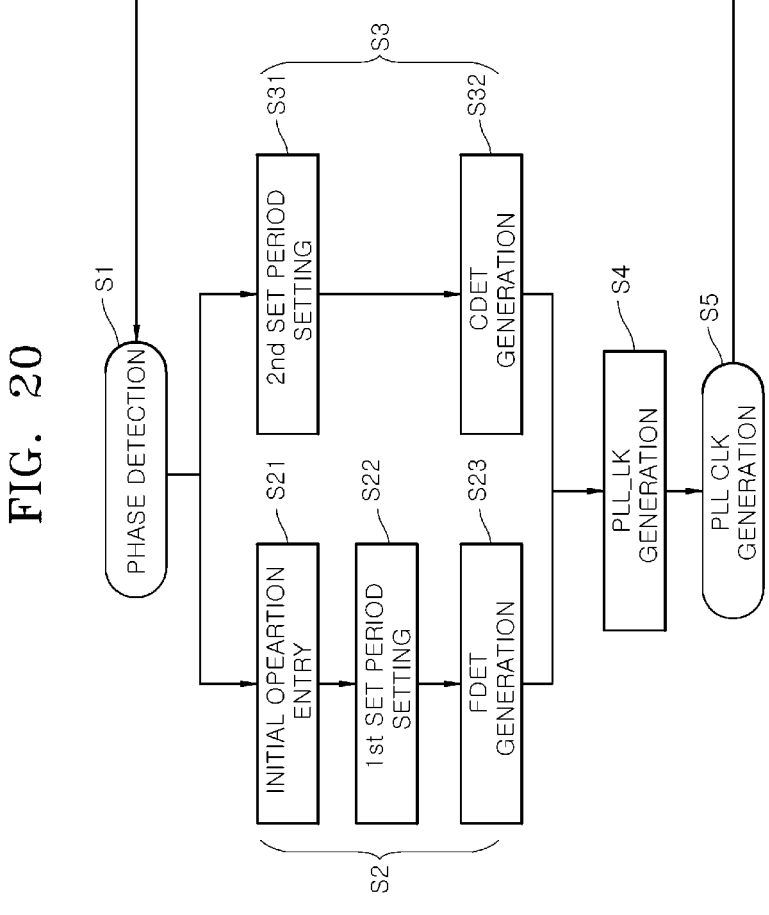

FIG. 20 is a flowchart for describing a method of adjusting a phase according to an embodiment of the present disclosure.

Figure 1:
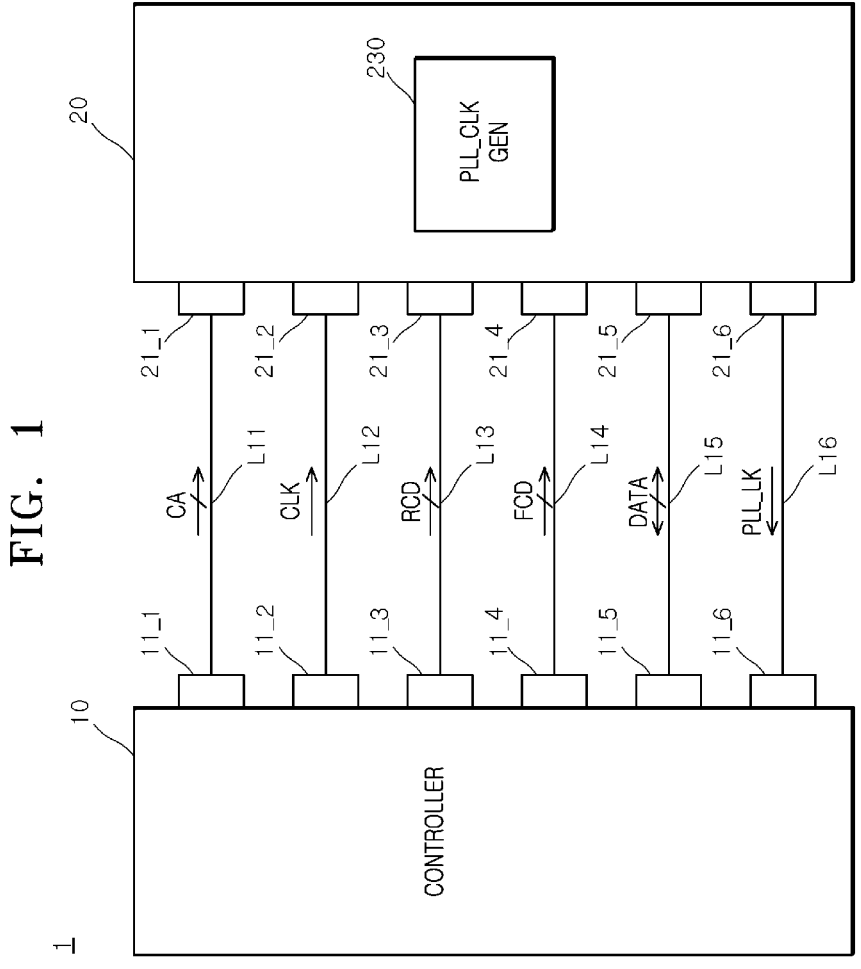
FIG. 1 is a block diagram illustrating a construction of an electronic system according to an embodiment of the present disclosure.
Figure 21:
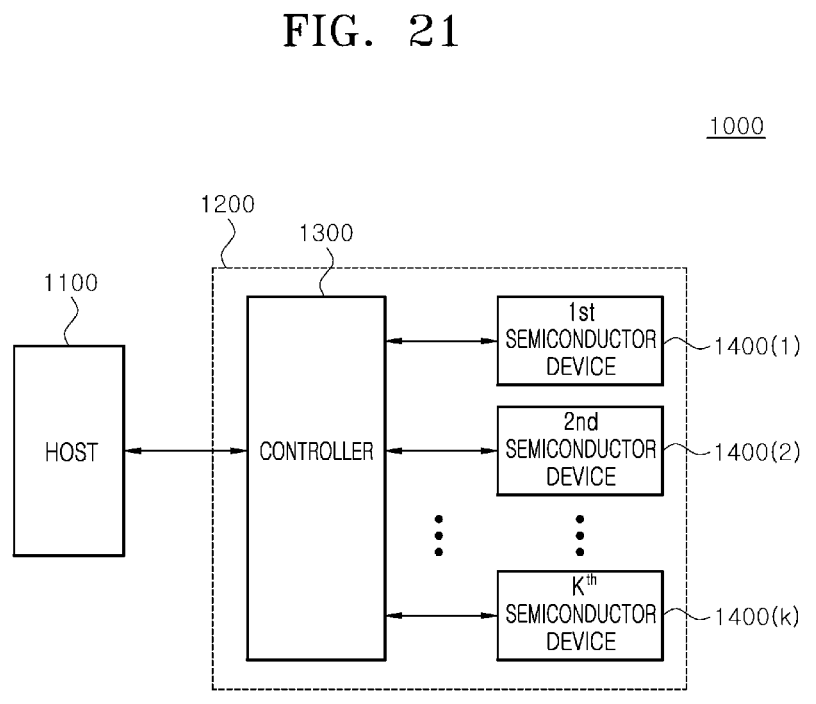

FIG. 21 is a diagram illustrating a construction according to an embodiment of an electronic system to which the electronic system illustrated in FIGS. 1 and 19 has been applied.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

Embodiments of the present disclosure may provide an electronic device and an electronic system, which can prevent the unnecessary generation of a phase-locked signal attributable to a jitter and noise by setting a first set period to be short based on a compensation code after the start of an initial operation, setting a second set period to be long based on an offset code, and generating a phase-locked signal.

According to the present disclosure, it is possible to prevent the unnecessary generation of the phase-locked signal attributable to a jitter and noise by setting the first set period to be short based on the compensation code after the start of an initial operation, setting the second set period to be long based the offset code, and generating the phase-locked signal.

As illustrated in FIG. 1, an electronic system 1, according to an embodiment of the present disclosure, may include a controller 10 and an electronic device 20. The electronic device 20 may include a PLL clock generation circuit (PLL_CLK GEN) 230.

The controller 10 may include a first control pin 11_1, a second control pin 11_2, a third control pin 11_3, a fourth control pin 11_4, a fifth control pin 11_5, and a sixth control pin 11_6. The electronic device 20 may include a first device pin 21_1, a second device pin 21_2, a third device pin 21_3, a fourth device pin 21_4, a fifth device pin 21_5, and a sixth device pin 21_6. A first transmission line L11 may be connected between the first control pin 11_1 and the first device pin 21_1. A second transmission line L12 may be connected between the second control pin 11_2 and the second device pin 21_2. A third transmission line L13 may be connected between the third control pin 11_3 and the third device pin 21_3. A fourth transmission line L14 may be connected between the fourth control pin 11_4 and the fourth device pin 21_4. A fifth transmission line L15 may be connected between the fifth control pin 11_5 and the fifth device pin 21_5. A sixth transmission line L16 may be connected between the sixth control pin 11_6 and the sixth device pin 21_6.

The controller 10 may transmit a command address CA for controlling the electronic device 20 to the electronic device 20 through the first transmission line L11. The controller 10 may transmit a clock CLK to the electronic device 20 through the second transmission line L12. The controller 10 may transmit a compensation code RCD to the electronic device 20 through the third transmission line L13. The controller 10 may transmit an offset code FCD to the electronic device 20 through the fourth transmission line L14. The controller 10 may transmit data DATA to the electronic device 20 through the fifth transmission line L15. The controller 10 may receive data DATA from the electronic device 20 through the fifth transmission line L15. The controller 10 may receive a phase-locked signal PLL_LK from the electronic device 20 through the sixth transmission line L16. The controller 10 may detect that the phase of a PLL clock (PLL_CLK in FIG. 2) is generated within a target period by receiving the phase-locked signal PLL_LK. The command address CA may include multiple bits and may be set as a signal including a command and an address for controlling an operation of the electronic device 20. The clock CLK may be set as a signal that is periodically toggled in order to synchronize operations of the controller 10 and the electronic device 20. The compensation code RCD may include multiple bits and may be set as a signal for setting a first set period for detecting a difference between the phases of a reference clock (RCLK in FIG. 3) and a feedback clock (FCLK in FIG. 3). The offset code FCD may include multiple bits and may be set as a signal for setting a second set period for detecting a difference between the phases of the reference clock (RCLK in FIG. 3) and the feedback clock (FCLK in FIG. 3). The first set period and the second set period may be set as different time periods. The first set period may be set as a time period that is shorter than the second set period. The data DATA may include multiple bits. The multiple bits may be input and output in series. The phase-locked signal PLL_LK may be set as a signal indicating that the phase of the PLL clock (PLL_CLK in FIG. 2) is generated within a target period.

The PLL clock generation circuit 230 may generate the PLL clock (PLL_CLK in FIG. 2) so that the phase of the PLL clock (PLL_CLK in FIG. 2) is generated within a target period. After the start of an initial operation, the PLL clock generation circuit 230 may set the first set period for detecting a difference between the phases of the reference clock (RCLK in FIG. 3) and the feedback clock (FCLK in FIG. 3) based on the compensation code RCD and may generate the phase-locked signal PLL_LK when a difference between the phases of the reference clock (RCLK in FIG. 3) and the feedback clock (FCLK in FIG. 3) is equal to or smaller than a first phase difference. After outputting the phase-locked signal PLL_LK, the PLL clock generation circuit 230 may set the second set period for detecting a difference between the phases of the reference clock (RCLK in FIG. 3) and the feedback clock (FCLK in FIG. 3) based on the offset code FCD, generate the phase-locked signal PLL_LK when a difference between the phases of the reference clock (RCLK in FIG. 3) and the feedback clock (FCLK in FIG. 3) is less than a second phase difference, which is greater than the first phase difference, and stop the generation of the phase-locked signal PLL_LK when a difference between the phases of the reference clock (RCLK in FIG. 3) and the feedback clock (FCLK in FIG. 3) is equal to or greater than the second phase difference, which is greater than the first phase difference. The initial operation may be set as an operation that is performed before a normal operation of the electronic device 20 is performed. The normal operation may include a write operation and a read operation of the electronic device 20.

The electronic device 20 may generate the PLL clock (PLL_CLK in FIG. 2) so that the phase of the PLL clock (PLL_CLK in FIG. 2) is generated within a target period. After the start of an initial operation, the electronic device 20 may set the first set period for detecting a difference between the phases of the reference clock (RCLK in FIG. 3) and the feedback clock (FCLK in FIG. 3) based on the compensation code RCD, and may generate the phase-locked signal PLL_LK when a difference between the phases of the reference clock (RCLK in FIG. 3) and the feedback clock (FCLK in FIG. 3) is equal to or smaller than the first phase difference. After outputting the phase-locked signal PLL_LK, the electronic device 20 may set the second set period for detecting a difference between the phases of the reference clock (RCLK in FIG. 3) and the feedback clock (FCLK in FIG. 3) based on the offset code FCD and may stop the generation of the phase-locked signal PLL_LK when a difference between the phases of the reference clock (RCLK in FIG. 3) and the feedback clock (FCLK in FIG. 3) is equal to or greater than the second phase difference, which is greater than the first phase difference. The electronic device 20 may store the data DATA in synchronization with the PLL clock (PLL_CLK in FIG. 2) after the start of a write operation of a normal operation. The electronic device 20 may output the data DATA in synchronization with the PLL clock (PLL_CLK in FIG. 2) after the start of a read operation of a normal operation.

Figure 2:
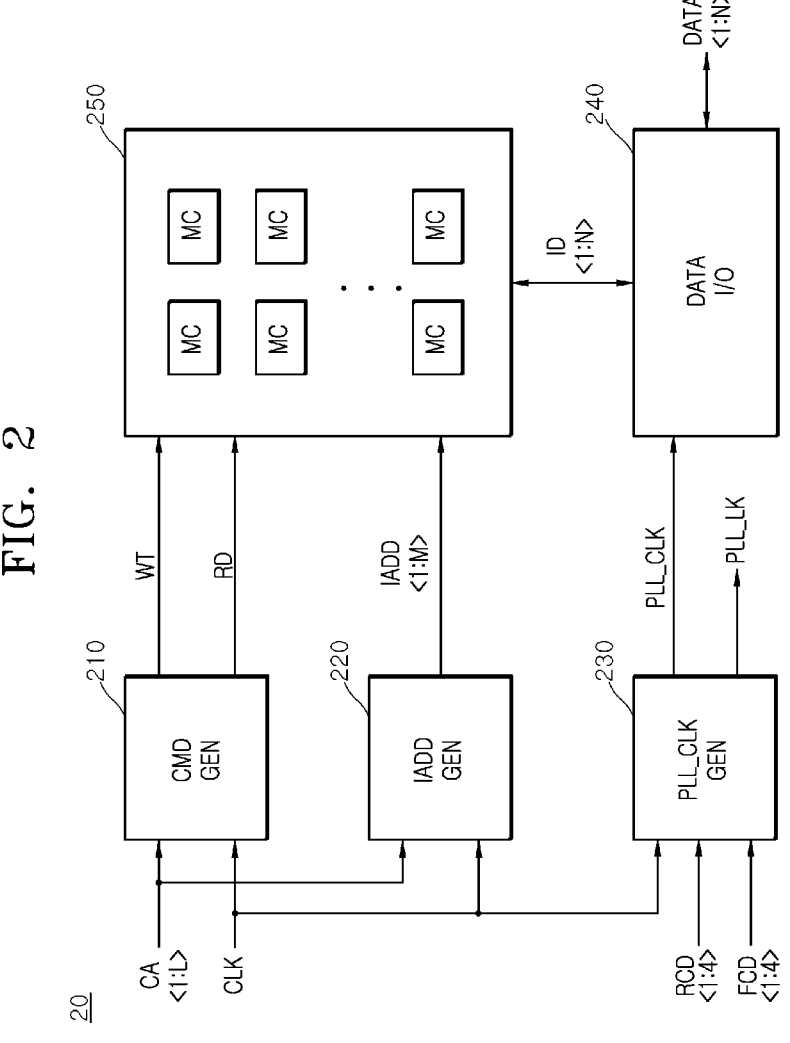
FIG. 2 is a block diagram illustrating a construction according to an embodiment of an electronic device that is included in the electronic system illustrated in FIG. 1.

As illustrated in FIG. 2, the electronic device 20, according to an embodiment of the present disclosure, may include a command generation circuit (CMD GEN) 210, an internal address generation circuit (IADD GEN) 220, a PLL clock generation circuit (PLL_CLK GEN) 230, a data input and output circuit (DATA I/O) 240, and a memory circuit 250.

The command generation circuit 210 may generate a write command WT and a read command RD based on first to L-th command addresses CA<1: L> in synchronization with the clock CLK. The command generation circuit 210 may generate the write command WT that is enabled when the first to L-th command addresses CA<1: L> that are input in synchronization with the clock CLK have a logic level combination for performing a write operation. The command generation circuit 210 may generate the read command RD that is enabled when the first to L-th command addresses CA<1: L> that are input in synchronization with the clock CLK have a logic level combination for performing a read operation. The first to L-th command addresses CA<1: L> may include a command for controlling a write operation and read operation of the electronic device 20 and an address for selecting a memory cell to perform the write operation and the read operation on. The number of bits of the first to L-th command addresses CA<1: L> may be set as various numbers of bits depending on the embodiment. The number "L" of bits of the first to L-th command addresses CA<1: L> may be set as a positive integer.

The internal address generation circuit 220 may generate first to M-th internal addresses IADD<1: M> based on the first to L-th command addresses CA<1: L> in synchronization with the clock CLK. The internal address generation circuit 220 may generate the first to M-th internal addresses IADD<1: M> by decoding the first to L-th command addresses CA<1: L> in synchronization with the clock CLK. The number of bits of the first to M-th internal addresses IADD<1: M> may be set as various numbers of bits depending on embodiments. The number "M" of bits of the first to M-th internal addresses IADD<1: M> may be set as a positive integer.

The PLL clock generation circuit 230 may generate the PLL clock PLL_CLK so that the phase of the PLL clock PLL_CLK is generated within a target period. After the start of an initial operation, the PLL clock generation circuit 230 may set the first set period for detecting a difference between the phases of the reference clock (RCLK in FIG. 3) and the feedback clock (FCLK in FIG. 3) based on first to fourth compensation codes RCD<1:4> and may generate the phase-locked signal PLL_LK when a difference between the phases of the reference clock (RCLK in FIG. 3) and the feedback clock (FCLK in FIG. 3) is equal to or smaller than the first phase difference during the first set period. After outputting the phase-locked signal PLL_LK, the PLL clock generation circuit 230 may set the second set period for detecting a difference between the phases of the reference clock (RCLK in FIG. 3) and the feedback clock (FCLK in FIG. 3) based on first to fourth offset codes FCD<1:4>, generate the phase-locked signal PLL_LK when a difference between the phases of the reference clock (RCLK in FIG. 3) and the feedback clock (FCLK in FIG. 3) is less than the second phase difference, which is greater than the first phase difference, during the second set period, and stop the generation of the phase-locked signal PLL_LK when a difference between the phases of the reference clock (RCLK in FIG. 3) and the feedback clock (FCLK in FIG. 3) is equal to or greater than the second phase difference, which is greater than the first phase difference, during the second set period. The operation of generating the PLL clock PLL_CLK, by the PLL clock generation circuit 230, so that the phase of the PLL clock PLL_CLK is generated within a target period may mean an operation of controlling the phase of the PLL clock PLL_CLK so that a difference between the phases of the reference clock (RCLK in FIG. 3) and the feedback clock (FCLK in FIG. 3) is smaller than the first phase difference. The phase-locked signal PLL_LK may be set as a signal that is enabled when the phase of the PLL clock (PLL_CLK in FIG. 2) is generated within a target period.

After the start of a write operation, the data input and output circuit 240 may sequentially latch first to N-th data DATA<1:N> in synchronization with a rising edge and falling edge of the PLL clock PLL_CLK and may generate first to N-th internal data ID<1:N> by aligning the first to N-th data DATA<1:N> that have been latched in synchronization with the rising edge and falling edge of the PLL clock PLL_CLK. The first to N-th data DATA<1:N> may be input from the controller 10 after the start of the write operation. After the start of a read operation, the data input and output circuit 240 may latch the first to N-th internal data ID<1:N> in synchronization with a rising edge and falling edge of the PLL clock PLL_CLK and may generate the first to N-th data DATA<1:N> by serializing the first to N-th internal data ID<1:N> that have been latched in synchronization with the rising edge and falling edge of the PLL clock PLL_CLK. The first to N-th data DATA<1:N> may be output to the controller 10 after the start of the read operation. The first to N-th data DATA<1:N> may be input and output in series. The first to N-th internal data ID<1:N> may be generated in parallel. The number of bits of each of the first to N-th data DATA<1:N> and the first to N-th internal data ID<1:N> may be set as various numbers of bits depending on the embodiment. The number "N" of bits of each of the first to N-th data DATA<1:N> and the first to N-th internal data ID<1:N> may be set as a positive integer.

The memory circuit 250 may include multiple memory cells MC. The memory circuit 250 may store the first to N-th internal data ID<1:N> in a memory cell MC that is selected by the first to M-th internal addresses IADD<1: M> when the write command WT is enabled. The memory circuit 250 may output the first to N-th internal data ID<1:N> that have been stored in the memory cell MC that is selected by the first to M-th internal addresses IADD<1: M> when the read command RD is enabled.

After the start of an initial operation, the electronic device 20 may set the first set period for detecting a difference between the phases of the reference clock (RCLK in FIG. 3) and the feedback clock (FCLK in FIG. 3) based on the first to fourth compensation codes RCD<1:4> and may generate the phase-locked signal PLL_LK when a difference between the phases of the reference clock (RCLK in FIG. 3) and the feedback clock (FCLK in FIG. 3) is equal to or smaller than the first phase difference during the first set period. After outputting the phase-locked signal PLL_LK, the electronic device 20 may set the second set period for detecting a difference between the phases of the reference clock (RCLK in FIG. 3) and the feedback clock (FCLK in FIG. 3) based on the first to fourth offset codes FCD<1:4>) and may stop the generation of the phase-locked signal PLL_LK when a difference between the phases of the reference clock (RCLK in FIG. 3) and the feedback clock (FCLK in FIG. 3) is equal to or greater than the second phase difference, which is greater than the first phase difference, during the second set period. The electronic device 20 may store the first to N-th data DATA<1:N> in synchronization with the PLL clock PLL_CLK after the start of a write operation of a normal operation. The electronic device 20 may output the first to N-th data DATA<1:N> in synchronization with the PLL clock PLL_CLK after the start of a read operation of the normal operation.

Figure 3:
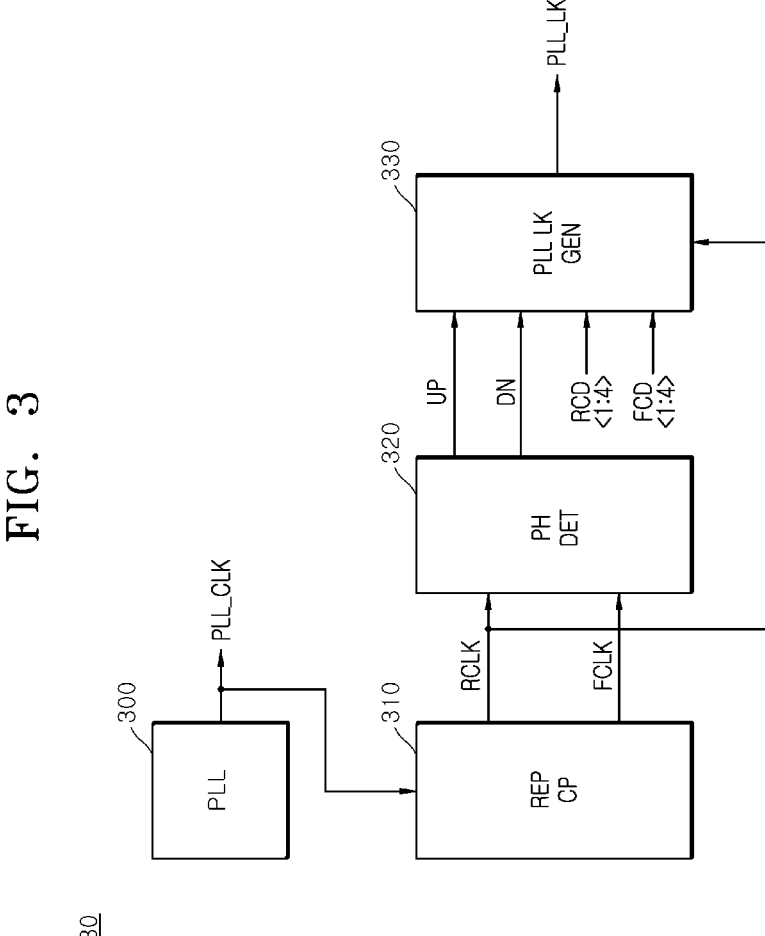
FIG. 3 is a block diagram illustrating a construction according to an embodiment of a PLL clock generation circuit that is included in the electronic device illustrated in FIG. 2.

FIG. 3 is a block diagram illustrating a construction according to an embodiment of the PLL clock generation circuit 230 that is included in the electronic device 20. The PLL clock generation circuit 230 may include a PLL circuit (PLL) 300, a replica circuit (REP CP) 310, a phase detection circuit (PH DET) 320, and a phase-locked signal generation circuit (PLL LK GEN) 330.

The PLL circuit 300 may generate the PLL clock PLL_CLK so that the phase of the PLL clock PLL_CLK is generated within a target period. The PLL circuit 300 may adjust the phase of the PLL clock PLL_CLK so that a difference between the phases of the reference clock RCLK and the feedback clock FCLK that are generated from the PLL clock PLL_CLK is smaller than the first phase difference. The PLL circuit 340 may be implemented with a common phase-locked loop (PLL).

The replica circuit 310 may generate the reference clock RCLK by receiving the PLL clock PLL_CLK. The reference clock RCLK may have the same phase as the PLL clock PLL_CLK. The replica circuit 310 may generate the feedback clock FCLK by delaying the reference clock RCLK based on an internal jitter value. The replica circuit 310 may generate the feedback clock FCLK by delaying the reference clock RCLK with the same delay quantity as the delay quantity of the internal jitter value.

The phase detection circuit 320 may generate a first driving control signal UP and a second driving control signal DN by detecting a difference between the phases of the reference clock RCLK and the feedback clock FCLK. The phase detection circuit 320 may generate the first driving control signal UP and the second driving control signal DN based on the results of the detection of a difference between the phases of the reference clock RCLK and the feedback clock FCLK. The phase detection circuit 320 may generate the first driving control signal UP that is enabled when the phase of the reference clock RCLK is earlier than the phase of the feedback clock FCLK. The phase detection circuit 320 may generate the second driving control signal DN that is enabled when the phase of the feedback clock FCLK is earlier than the phase of the reference clock RCLK.

After the start of an initial operation, the phase-locked signal generation circuit 330 may set the first set period for detecting a difference between the phases of the reference clock RCLK and the feedback clock FCLK based on the first driving control signal UP, the second driving control signal DN, and the first to fourth compensation codes RCD<1:4>, generate the phase-locked signal PLL_LK that is enabled when a difference between the phases of the reference clock (RCLK in FIG. 3) and the feedback clock (FCLK in FIG. 3) is equal to or smaller than the first phase difference during the first set period, and generate the phase-locked signal PLL_LK that is disabled when a difference between the phases of the reference clock (RCLK in FIG. 3) and the feedback clock (FCLK in FIG. 3) is greater than the first phase difference during the first set period. After outputting the phase-locked signal PLL_LK, the phase-locked signal generation circuit 330 may set the second set period for detecting a difference between the phases of the reference clock RCLK and the feedback clock FCLK based on the first driving control signal UP, the second driving control signal DN, and the first to fourth offset codes FCD<1:4>, generate the phase-locked signal PLL_LK that is enabled when a difference between the phases of the reference clock (RCLK in FIG. 3) and the feedback clock (FCLK in FIG. 3) is less than the second phase difference, which is greater than the first phase difference, during the second set period, generate the phase-locked signal PLL_LK that is disabled when a difference between the phases of the reference clock (RCLK in FIG. 3) and the feedback clock (FCLK in FIG. 3) is equal to or greater than the second phase difference, which is greater than the first phase difference, during the second set period, and stop the generation of the phase-locked signal PLL_LK when a difference between the phases of the reference clock (RCLK in FIG. 3) and the feedback clock (FCLK in FIG. 3) is equal to or greater than the second phase difference, which is greater than the first phase difference, during the second set period.

Figure 4:
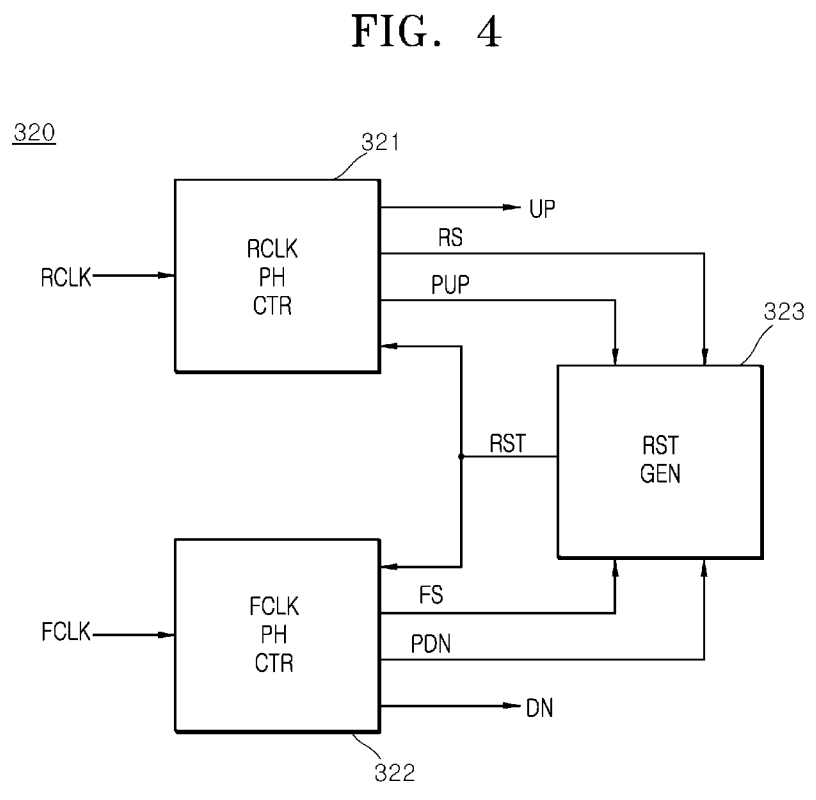

FIG. 4 is a block diagram illustrating a construction according to an embodiment of the phase detection circuit 320 that is included in the PLL clock generation circuit 230. The phase detection circuit 320 may include a reference clock phase control circuit (RCLK PH CTR) 321, a feedback clock phase control circuit (FCLK PH CTR) 322, and a reset signal generation circuit (RST GEN) 323.

The reference clock phase control circuit 321 may generate a reference setting signal RS, a first pre-driving control signal PUP, and a first driving control signal UP based on the reference clock RCLK and a reset signal RST. The reference clock phase control circuit 321 may generate the reference setting signal RS that is enabled when the level of the reference clock RCLK transitions from a first logic level (logic low level) to a second logic level (logic high level). The reference clock phase control circuit 321 may generate the first pre-driving control signal PUP that is enabled when the reference setting signal RS is enabled and disabled when the reset signal RST is enabled. The reference clock phase control circuit 321 may generate the first driving control signal UP based on the reference setting signal RS, the first pre-driving control signal PUP, and the reset signal RST.

The feedback clock phase control circuit 322 may generate a feedback setting signal FS, a second pre-driving control signal PDN, and a second driving control signal DN based on the feedback clock FCLK and the reset signal RST. The feedback clock phase control circuit 322 may generate the feedback setting signal FS that is enabled when the level of the feedback clock FCLK transitions from the first logic level (logic low level) to the second logic level (logic high level). The feedback clock phase control circuit 322 may generate the second pre-driving control signal PDN that is enabled when the feedback setting signal FS is enabled and disabled when the reset signal RST is enabled. The feedback clock phase control circuit 322 may generate the second driving control signal DN based on the feedback setting signal FS, the second pre-driving control signal PDN, and the reset signal RST.

The reset signal generation circuit 323 may generate the reset signal RST based on the reference setting signal RS, the first pre-driving control signal PUP, the feedback setting signal FS, and the second pre-driving control signal PDN. The reset signal generation circuit 323 may generate the reset signal RST that is enabled when all of the reference setting signal RS, the first pre-driving control signal PUP, the feedback setting signal FS, and the second pre-driving control signal PDN are enabled.

Figure 5:
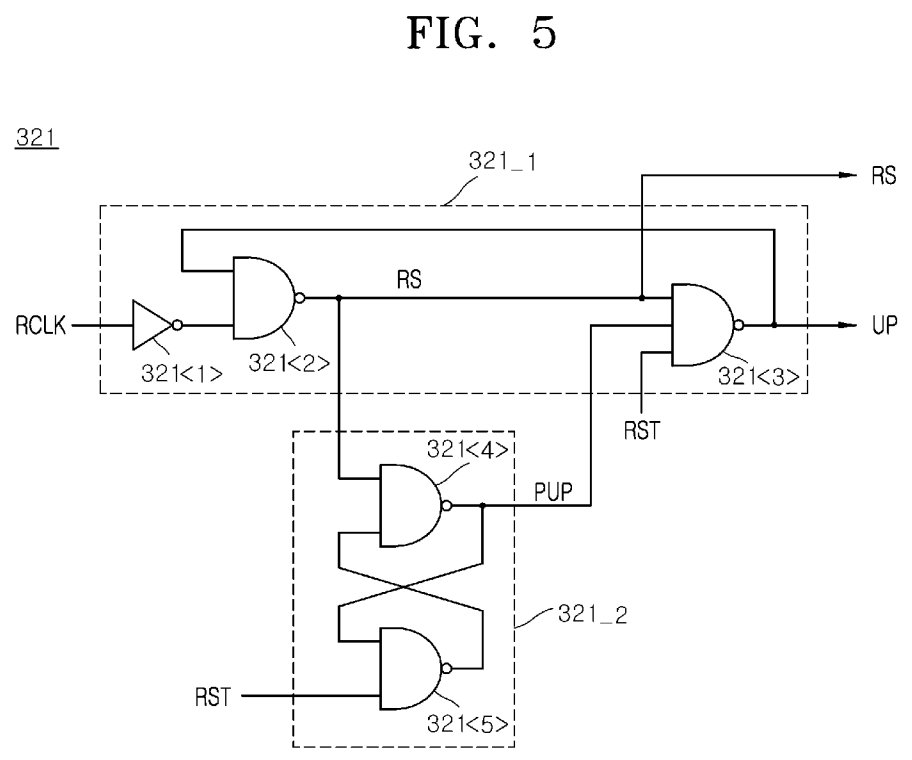

FIG. 5 is a circuit diagram illustrating a construction according to an embodiment of the reference clock phase control circuit 321 that is included in the phase detection circuit 320. The reference clock phase control circuit 321 may include a first driving control signal generation circuit 321_1 and a first pre-driving control signal generation circuit 321_2.

The first driving control signal generation circuit 321_1 may be implemented with an inverter 321<1> and NAND gates 321<2> and 321<3>. The first driving control signal generation circuit 321_1 may generate the reference setting signal RS that is enabled to a logic high level when the level of the reference clock RCLK transitions from a logic low level to a logic high level. The first driving control signal generation circuit 321_1 may generate the first driving control signal UP that is enabled to a logic low level when both the reference setting signal RS and the first pre-driving control signal PUP are enabled to a logic high level during a period in which the reset signal RST is disabled to a logic high level. The first driving control signal generation circuit 321_1 may generate the first driving control signal UP that is disabled to a logic high level when at least one of the reset signal RST, the reference setting signal RS, and the first pre-driving control signal PUP is generated to have a logic low level.

The first pre-driving control signal generation circuit 321_2 may be implemented with NAND gates 321<4> and 321<5>. The first pre-driving control signal generation circuit 321_2 may generate the first pre-driving control signal PUP based on the reference setting signal RS and the reset signal RST. The first pre-driving control signal generation circuit 321_2 may generate the first pre-driving control signal PUP that is enabled to a logic high level when the level of the reference setting signal RS is a logic low level. The first pre-driving control signal generation circuit 321_2 may generate the first pre-driving control signal PUP that is enabled to a logic high level when the level of the reference setting signal RS is a logic low level. The first pre-driving control signal generation circuit 321_2 may generate the first pre-driving control signal PUP that is disabled to a logic low level when the level of the reference setting signal RS is a logic high level and the level of the reset signal RST is a logic low level.

Figure 6:
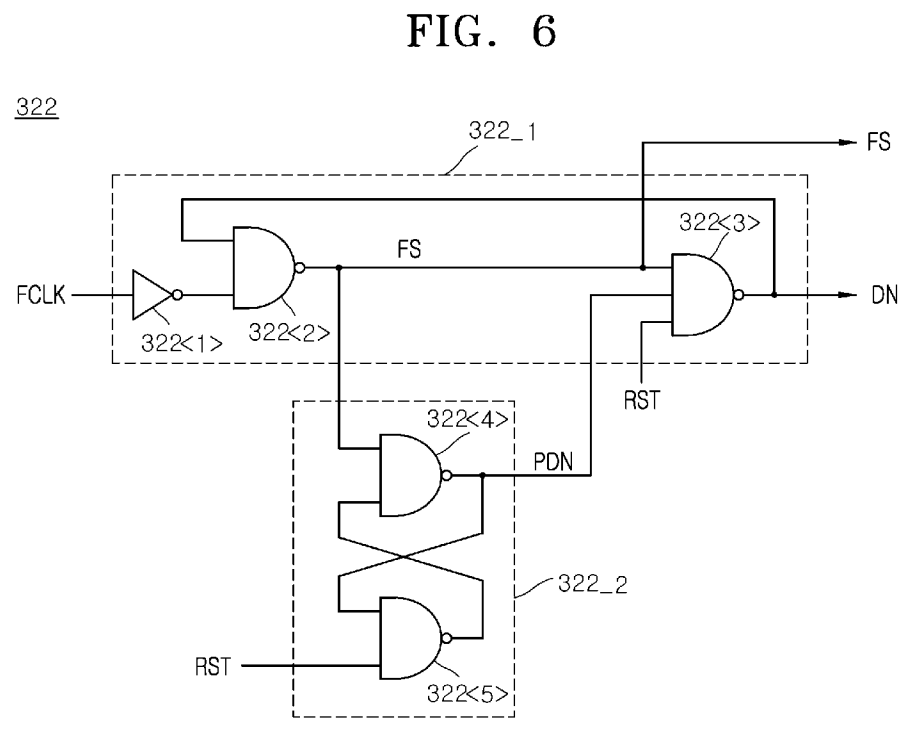

FIG. 6 is a circuit diagram illustrating a construction according to an embodiment of the feedback clock phase control circuit 322 that is included in the phase detection circuit 320. The feedback clock phase control circuit 322 may include a second driving control signal generation circuit 322_1 and a second pre-driving control signal generation circuit 322_2.

The second driving control signal generation circuit 322_1 may be implemented with an inverter 322<1> and NAND gates 322<2> and 322<3>. The second driving control signal generation circuit 322_1 may generate the feedback setting signal FS that is enabled to a logic high level when the level of the feedback clock FCLK transitions from a logic low level to a logic high level. The second driving control signal generation circuit 322_1 may generate the second driving control signal DN that is enabled to a logic low level when both the feedback setting signal FS and the second pre-driving control signal PDN are enabled to a logic high level during the period in which the reset signal RST is disabled to a logic high level. The second driving control signal generation circuit 322_1 may generate the second driving control signal DN that is disabled to a logic high level when at least one of the reset signal RST, the feedback setting signal FS, and the second pre-driving control signal PDN is generated to have a logic low level.

The second pre-driving control signal generation circuit 322_2 may be implemented with NAND gates 322<4> and 322<5>. The second pre-driving control signal generation circuit 322_2 may generate the second pre-driving control signal PDN, based on the feedback setting signal FS and the reset signal RST. The second pre-driving control signal generation circuit 322_2 may generate the second pre-driving control signal PDN that is enabled to a logic high level when the level of the feedback setting signal FS is a logic low level. The second pre-driving control signal generation circuit 322_2 may generate the second pre-driving control signal PDN that is disabled to a logic low level, when the level of the feedback setting signal FS is a logic high level and the level of the reset signal RST is a logic low level.

Figure 7:
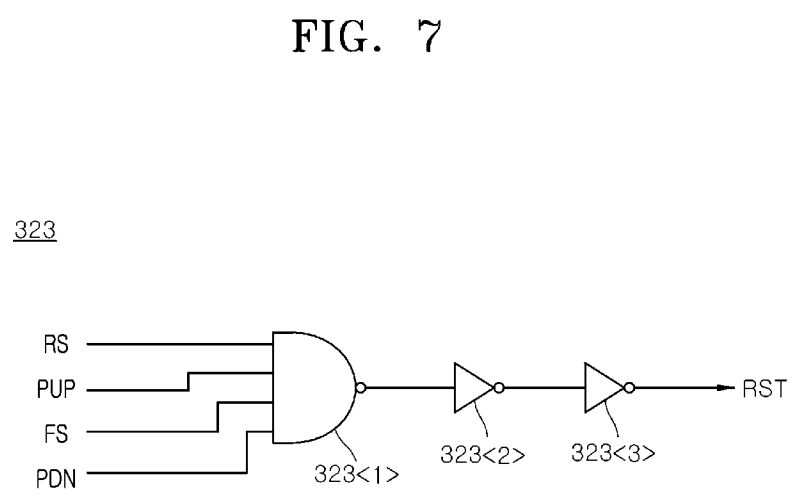

FIG. 7 is a circuit diagram illustrating a construction according to an embodiment of the reset signal generation circuit 323 that is included in the phase detection circuit 320.

The reset signal generation circuit 323 may be implemented with a NAND gate 323<1> and inverters 323<2> and 323<3>. The reset signal generation circuit 323 may generate the reset signal RST that is enabled to a logic low level when all of the reference setting signal RS, the first pre-driving control signal PUP, the feedback setting signal FS, and the second pre-driving control signal PDN are enabled to a logic high level. The reset signal generation circuit 323 may generate the reset signal RST that is disabled to a logic high level when the level of at least one of the reference setting signal RS, the first pre-driving control signal PUP, the feedback setting signal FS, and the second pre-driving control signal PDN is a logic low level.

Figure 8:
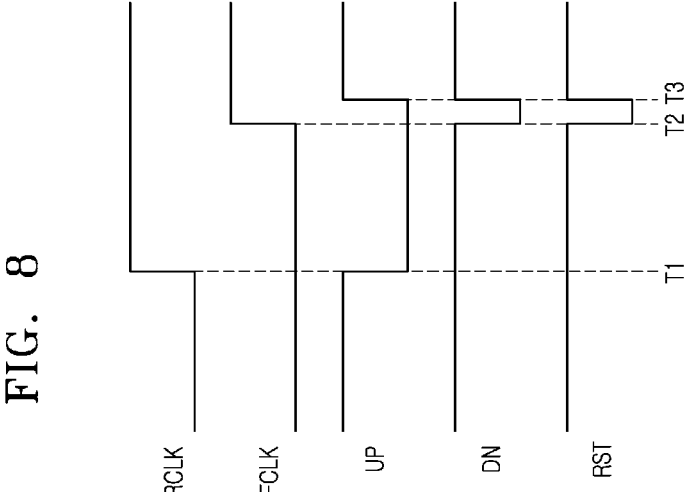
FIGS. 8 and 9 are timing diagrams for describing an operation of the phase detection circuit according to an embodiment of the present disclosure.

FIG. 8 is a timing diagram for describing an operation of the phase detection circuit 320 according to an embodiment of the present disclosure. The operation of the phase detection circuit 320 is described with reference to FIG. 8. An operation of the phase detection circuit 320 when the phase of the reference clock RCLK is earlier than the phase of the feedback clock FCLK is described as follows.

At timing T1, the level of the reference clock RCLK may transition from a logic low level to a logic high level.

The first driving control signal generation circuit 321_1 of the reference clock phase control circuit 321 may generate the reference setting signal RS (not shown) that is enabled to a logic high level when the level of the reference clock RCLK transitions from a logic low level to a logic high level. The first driving control signal generation circuit 321_1 may generate the first driving control signal UP that is enabled to a logic low level based on the reference setting signal RS and the first pre-driving control signal PUP (not shown), both of which are enabled to a logic high level during the period in which the reset signal RST is disabled to a logic high level.

At timing T2, the level of the feedback clock FCLK may transition from a logic low level to a logic high level.

The second driving control signal generation circuit 322_1 of the feedback clock phase control circuit 322 may generate the feedback setting signal FS (not shown) that is enabled to a logic high level when the level of the feedback clock FCLK transitions from a logic low level to a logic high level. The first driving control signal generation circuit 321_1 may generate the second driving control signal DN that is enabled to a logic low level, based on the feedback setting signal FS and the second pre-driving control signal PDN (not shown) both of which are enabled to a logic high level during the period in which the reset signal RST is disabled to a logic high level.

The reset signal generation circuit 323 may generate the reset signal RST that is enabled to a logic low level when all of the reference setting signal RS, the first pre-driving control signal PUP, the feedback setting signal FS, and the second pre-driving control signal PDN are enabled to a logic high level.

At timing T3, the first driving control signal generation circuit 321_1 may generate the first driving control signal UP that is disabled to a logic high level by the reset signal RST that is enabled to a logic low level at timing T2. The first driving control signal generation circuit 321_1 may generate the first pre-driving control signal PUP that is disabled to a logic low level by the reset signal RST that is enabled to a logic low level at timing T2.

The second driving control signal generation circuit 322_1 may generate the second driving control signal DN that is disabled to a logic high level by the reset signal RST that is enabled to a logic low level at timing T2. The second driving control signal generation circuit 322_1 may generate the second pre-driving control signal PDN that is disabled to a logic low level by the reset signal RST that is enabled to a logic low level at timing T2.

The reset signal generation circuit 323 may generate the reset signal RST that is disabled to a logic high level based on the first pre-driving control signal PUP having a logic low level and the second pre-driving control signal PDN having a logic low level.

The phase detection circuit 320 may generate the first driving control signal UP that is enabled when the phase of the reference clock RCLK is earlier than the phase of the feedback clock FCLK and may generate the second driving control signal DN that is disabled when the phase of reference clock RCLK is earlier than the phase of feedback clock FCLK.

Figure 9:
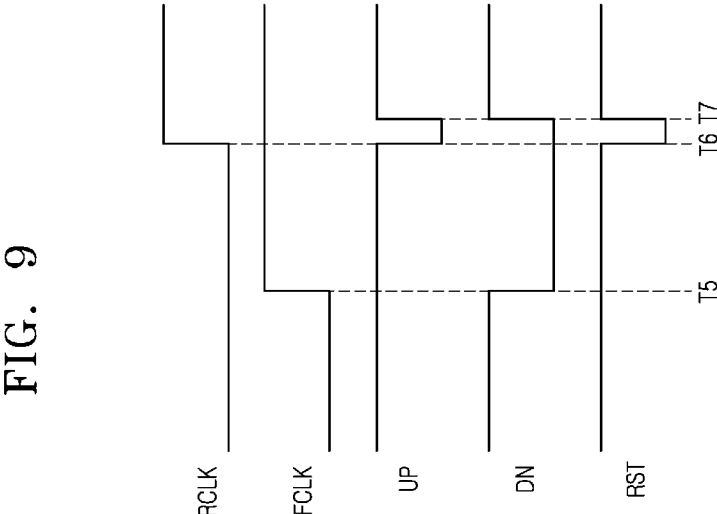

FIG. 9 is a timing diagram for describing an operation of the phase detection circuit 320 according to an embodiment of the present disclosure. The operation of the phase detection circuit 320 is described with reference to FIG. 9. An operation of the phase detection circuit 320 when the phase of the feedback clock FCLK is earlier than the phase of the reference clock RCLK is described as follows.

At timing T5, the level of the feedback clock FCLK may transition from a logic low level to a logic high level.

The second driving control signal generation circuit 322_1 of the feedback clock phase control circuit 322 may generate the feedback setting signal FS that is enabled to a logic high level when the level of the feedback clock FCLK transitions from a logic low level to a logic high level. The first driving control signal generation circuit 321_1 may generate the second driving control signal DN that is enabled to a logic low level based on the feedback setting signal FS and the second pre-driving control signal PDN being enabled to a logic high level during the period in which the reset signal RST is disabled to a logic high level.

At timing T6, the level of the reference clock RCLK may transition from a logic low level to a logic high level.

The first driving control signal generation circuit 321_1 of the reference clock phase control circuit 321 may generate the reference setting signal RS that is enabled to a logic high level when the level of the reference clock RCLK transitions from a logic low level to a logic high level. The first driving control signal generation circuit 321_1 may generate the first driving control signal UP that is enabled to a logic low level, based on the reference setting signal RS and the first pre-driving control signal PUP being enabled to a logic high level during the period in which the reset signal RST is disabled to a logic high level.

The reset signal generation circuit 323 may generate the reset signal RST that is enabled to a logic low level when all of the reference setting signal RS, the first pre-driving control signal PUP, the feedback setting signal FS, and the second pre-driving control signal PDN are enabled to a logic high level.

At timing T7, the first driving control signal generation circuit 321_1 may generate the first driving control signal UP that is disabled to a logic high level by the reset signal RST that is enabled to a logic low level at timing T6. The first driving control signal generation circuit 321_1 may generate the first pre-driving control signal PUP that is disabled to a logic low level by the reset signal RST that is enabled to a logic low level at timing T6.

The second driving control signal generation circuit 322_1 may generate the second driving control signal DN that is disabled to a logic high level by the reset signal RST that is enabled to a logic low level at timing T6. The second driving control signal generation circuit 322_1 may generate the second pre-driving control signal PDN that is disabled to a logic low level by the reset signal RST that is enabled to a logic low level at timing T6.

The reset signal generation circuit 323 may generate the reset signal RST that is disabled to a logic high level based on the first pre-driving control signal PUP having a logic low level and the second pre-driving control signal PDN having a logic low level.

The phase detection circuit 320 may generate the second driving control signal DN that is enabled when the phase of the feedback clock FCLK is earlier than the phase of the reference clock RCLK and may generate the first driving control signal UP that is disabled when the phase of the feedback clock FCLK is earlier than the phase of the reference clock RCLK.

FIG. 10 is a block diagram illustrating a construction according to an embodiment of the phase-locked signal generation circuit 330 that is included in the PLL clock generation circuit 230. The phase-locked signal generation circuit 330 may include an initial detection signal generation circuit (FDET GEN) 331, an operation detection signal generation circuit (CDET GEN) 332, and a latch circuit (LAT CT) 333.

During the first set period after the start of an initial operation, the initial detection signal generation circuit 331 may generate an initial detection signal FDET by detecting the number of toggles of the reference clock RCLK based on the first driving control signal UP, the second driving control signal DN, and the first to fourth compensation codes RCD<1:4>. After the start of the initial operation, the initial detection signal generation circuit 331 may set the first set period based on the first driving control signal UP, the second driving control signal DN, and the first to fourth compensation codes RCD<1:4>. During the first set period, the initial detection signal generation circuit 331 may generate the initial detection signal FDET that is enabled when a difference between the phases of the reference clock RCLK and the feedback clock FCLK is equal to or smaller than the first phase difference and may generate the initial detection signal FDET when that is disabled when a difference between the phases of the reference clock RCLK and the feedback clock FCLK is less than the first phase difference.

The operation detection signal generation circuit 332 may generate an operation detection signal CDET by detecting the number of toggles of the reference clock RCLK during the second set period based on the first driving control signal UP, the second driving control signal DN, and the first to fourth offset codes FCD<1:4>. The operation detection signal generation circuit 332 may set the second set period based on the first driving control signal UP, the second driving control signal DN, and the first to fourth offset codes FCD<1:4>. During the second set period, the operation detection signal generation circuit 332 may generate the operation detection signal CDET that is enabled when a difference between the phases of the reference clock RCLK and the feedback clock FCLK is less than the second phase difference, which is greater than the first phase difference, and may generate the operation detection signal CDET that is disabled when a difference between the phases of the reference clock RCLK and the feedback clock FCLK is equal to or greater than the second phase difference, which is greater than the first phase difference.

The latch circuit 333 may be electrically connected to the initial detection signal generation circuit 331 directly and may receive the initial detection signal FDET. The latch circuit 333 may be electrically connected to the operation detection signal generation circuit 332 directly and may receive the operation detection signal CDET. Based on the initial detection signal FDET and the operation detection signal CDET, the latch circuit 333 may generate the phase-locked signal PLL_LK that is enabled when the phase of the PLL clock (PLL_CLK in FIG. 2) is generated within a target period. The latch circuit 333 may generate the phase-locked signal PLL_LK when both the initial detection signal FDET and the operation detection signal CDET are enabled. The latch circuit 333 may stop the generation of the phase-locked signal PLL_LK when the operation detection signal CDET is disabled after the initial detection signal FDET is enabled.

The first set period, the second set period, the first phase difference, and the second phase difference are specifically described with reference to FIGS. 11 to 13.

Figure 11:
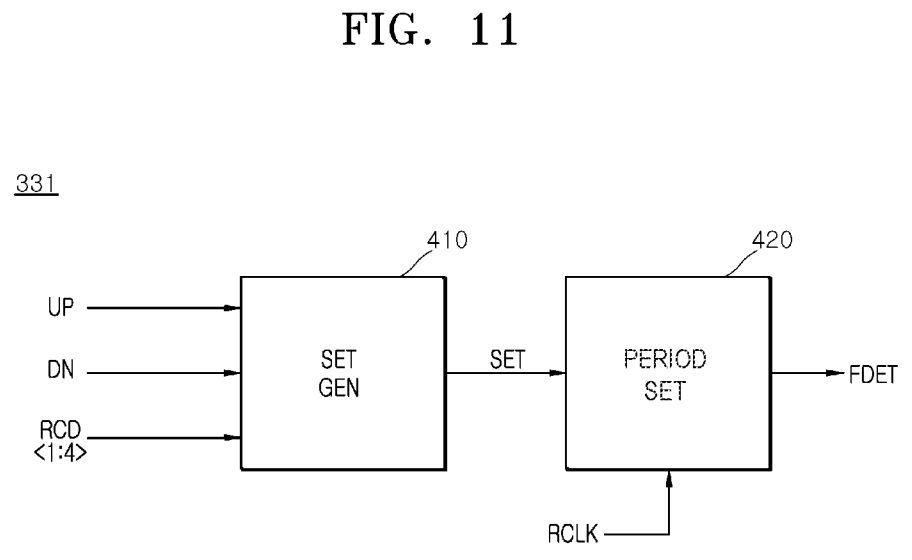

FIG. 11 is a block diagram illustrating a construction according to an embodiment of the initial detection signal generation circuit 331 that is included in the phase-locked signal generation circuit 330. The initial detection signal generation circuit 331 may include a first setting signal generation circuit (SET GEN) 410 and a first period setting circuit (PERIOD SET) 420.

The first setting signal generation circuit 410 may generate a first internal pulse (IP in FIG. 12) by synthesizing the first driving control signal UP and the second driving control signal DN. The first setting signal generation circuit 410 may generate a first selection pulse (SP in FIG. 12) by delaying the first internal pulse (IP in FIG. 12) for the first set period based on the first to fourth compensation codes RCD<1:4>. The first setting signal generation circuit 410 may generate a first set signal SET based on the first selection pulse (SP in FIG. 12) and the first internal pulse (IP in FIG. 12).

The first period setting circuit 420 may generate the initial detection signal FDET based on the first set signal SET and the reference clock RCLK. When the reference clock RCLK is toggled a set number of times, the first period setting circuit 420 may generate the initial detection signal FDET that is enabled when the first set signal SET is disabled. When the reference clock RCLK is toggled a set number of times, the first period setting circuit 420 may generate the initial detection signal FDET that is disabled when the first set signal SET is enabled.

Figure 12:
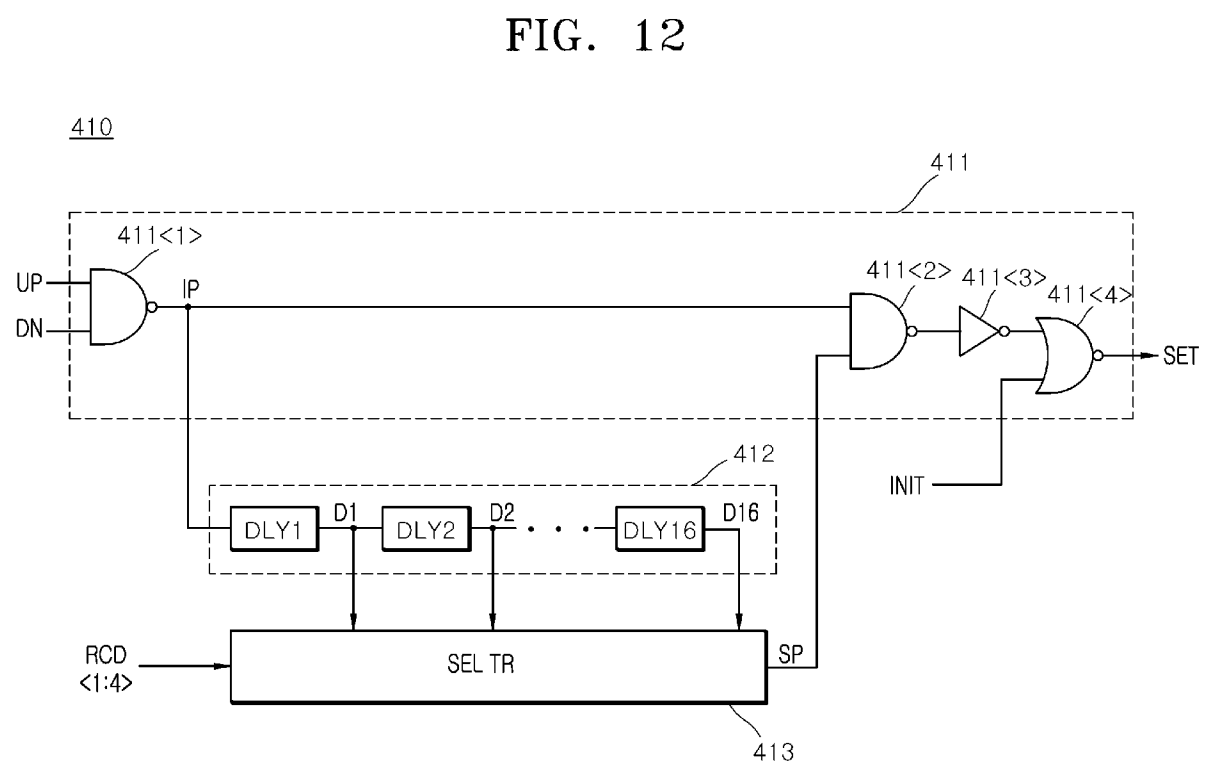

FIG. 12 is a diagram illustrating a construction according to an embodiment of the first setting signal generation circuit 410 that is included in the initial detection signal generation circuit 331. The first setting signal generation circuit 410 may include a first signal synthesis circuit 411, a first delay circuit 412, and a first selection transfer circuit (SEL TR) 413.

The first signal synthesis circuit 411 may be implemented with NAND gates 411<1> and 411<2>, an inverter 411<3>, and a NOR gate 411<4>. The first signal synthesis circuit 411 may generate the first internal pulse IP by synthesizing the first driving control signal UP and the second driving control signal DN. The first signal synthesis circuit 411 may generate the first internal pulse IP having a logic high level by synthesizing during a period in which the first driving control signal UP is enabled to a logic low level and a period in which the second driving control signal DN is enabled to a logic low level. The first signal synthesis circuit 411 may generate the first set signal SET by synthesizing the first internal pulse IP and the first selection pulse SP. The first signal synthesis circuit 411 may generate the first set signal SET having a logic low level by synthesizing during a period in which the first internal pulse IP is enabled to a logic high level and a period in which the first selection pulse SP is enabled to a logic high level. The first signal synthesis circuit 411 may generate the first set signal SET that is initialized to a logic low level when an initialization signal INIT is enabled to a logic high level prior to an initial operation.

The first delay circuit 412 may include first to sixteenth unit delayers DLY1 to DLY16. The first to sixteenth unit delayers DLY1 to DLY16 may generate first to sixteenth delay signals D1 to D16, respectively, by sequentially delaying the first internal pulse IP. Each of the first to sixteenth unit delayers DLY1 to DLY16 that are included in the first delay circuit 412 may be implemented with a common delayer that outputs an input signal by delaying the input signal for the same delay quantity. The delay quantity of each of the first to sixteenth unit delayers DLY1 to DLY16 may be variously set depending on an embodiment.

The first selection transfer circuit 413 may output one of the first to sixteenth delay signals D1 to D16 as the first selection pulse SP based on a logic level combination of the first to fourth compensation codes RCD<1:4>. For example, when the first to sixteenth delay signals D1 to D16 are "0, 0, 0, 0", the first selection transfer circuit 413 may output the first delay signal D1 as the first selection pulse SP. When the first to sixteenth delay signals D1 to D16 are "0, 0, 0, 1", the first selection transfer circuit 413 may output the second delay signal D2 as the first selection pulse SP. When the first to sixteenth delay signals D1 to D16 are "1, 1, 1, 1", the first selection transfer circuit 413 may output the sixteenth delay signal D16 as the first selection pulse SP.

Figure 13:
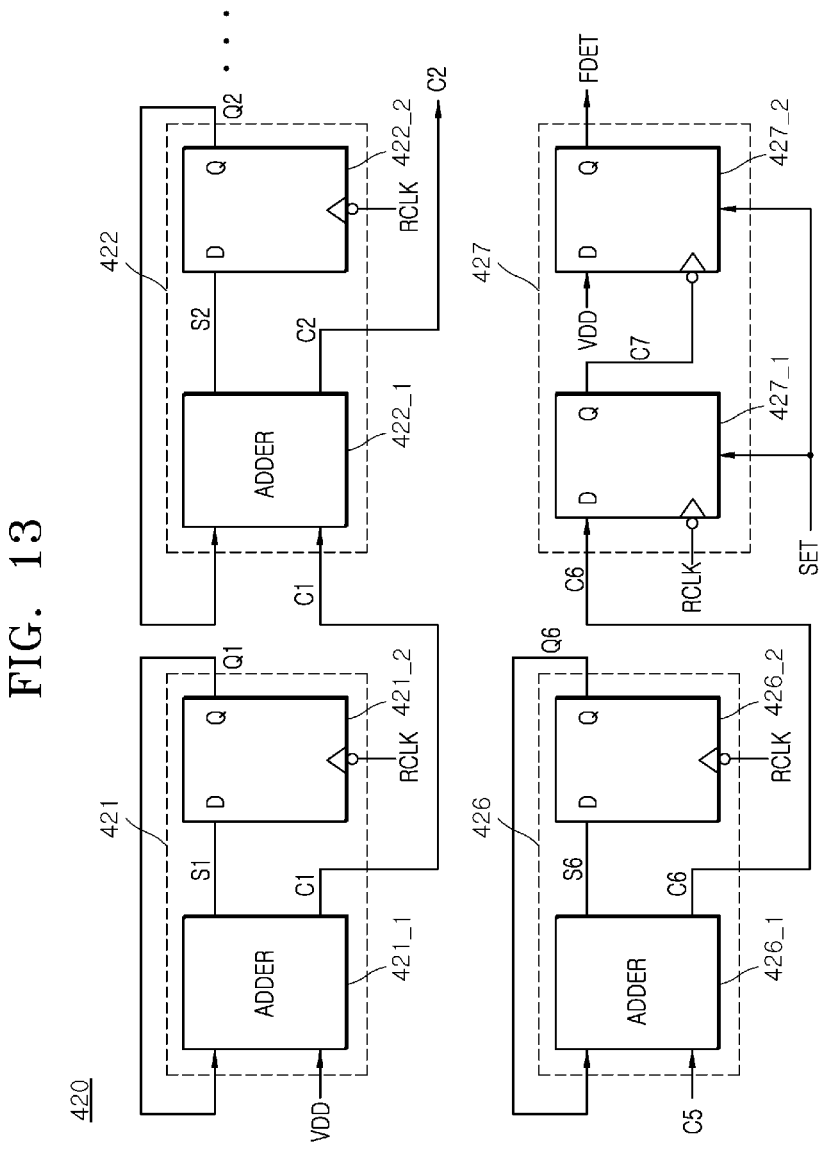
FIG. 13 is a block diagram illustrating a construction according to an embodiment of a period setting circuit that is included in the initial detection signal generation circuit illustrated in FIG. 11.

FIG. 13 is a block diagram illustrating a construction according to an embodiment of the first period setting circuit 420 that is included in the initial detection signal generation circuit 331. The first period setting circuit 420 may include first to sixth counters 421 to 426 and a first detection signal output circuit 427.

The first counter 421 may include an adder (ADDER) 421_1 and a flip-flop 421_2. The adder 421_1 may generate a first sum signal S1 and a first carry signal C1 by adding a power source voltage VDD and a first transfer signal Q1. The flip-flop 421_2 may output the first sum signal S1 as the first transfer signal Q1 by inverting the first sum signal S1 when the level of the reference clock RCLK transitions to a logic low level. The first counter 421 may generate the first carry signal C1 having a logic high level whenever the level of the reference clock RCLK transitions to a logic low level twice by performing an addition operation.

The second counter 422 may include an adder 422_1 and a flip-flop 422_2. The adder 422_1 may generate a second sum signal S2 and a second carry signal C2 by adding the first carry signal C1 and a second transfer signal Q2. The flip-flop 422_2 may output the second sum signal S2 as the second transfer signal Q2 by inverting the second sum signal S2 when the level of the reference clock RCLK transitions to a logic low level. The second counter 422 may generate the second carry signal C2 having a logic high level whenever the level of the reference clock RCLK transitions to a logic low level for the fourth time by performing an addition operation.

The third to fifth counters 423 to 425 may each perform the same operation as the second counter 422 except their input and output signals, and detailed descriptions thereof have been omitted.

The sixth counter 426 may include an adder (ADDER) 426_1 and a flip-flop 426_2. The adder 426_1 may generate a sixth sum signal S6 and a sixth carry signal C6 by adding a fifth carry signal C5 and a sixth transfer signal Q6. The flip-flop 426_2 may output the sixth sum signal S6 as the sixth transfer signal Q6 by inverting the sixth sum signal S6 when the level of the reference clock RCLK transitions to a logic low level. The sixth counter 426 may generate the sixth carry signal C6 having a logic high level whenever the level of the reference clock RCLK transitions to a logic low level for the twelfth time by performing an addition operation.

The first to sixth counters 421 to 426 may be set as a first group of counters.

The first detection signal output circuit 427 may include flip-flops 427_1 and 427_2. The flip-flop 427_1 may output a sixth carry signal S6 as a seventh carry signal Q7 by inverting the sixth carry signal S6 when the level of the reference clock RCLK transitions to a logic low level during a period in which the first set signal SET having a logic low level is generated. The flip-flop 427_1 may generate the seventh carry signal Q7 having a logic low level when the first set signal SET having a logic high level is generated. The flip-flop 427_2 may output the power source voltage VDD as the initial detection signal FDET when the level of the seventh carry signal Q7 transitions to a logic low level during the period in which the first set signal SET having a logic low level is generated. The flip-flop 427_2 may generate the initial detection signal FDET having a logic low level when the first set signal SET having a logic high level is generated.

The first set period may mean a period from a time at which the first internal pulse IP having a logic high level is generated to a time at which the first selection pulse SP having a logic high level is generated. The first phase difference may mean the time at which the first set signal SET is disabled to a logic low level until the level of the reference clock RCLK transitions to a logic low level for the twelfth time, that is, a set number of times. That is, when the level of the reference clock RCLK transitions to a logic low level for the twelfth time, the initial detection signal generation circuit 331 may generate the initial detection signal FDET having a logic high level when the first set signal SET having a logic low level is generated and may generate the initial detection signal FDET having a logic low level when the first set signal SET having a logic high level is generated. The first set period may be adjusted as a logic level combination of the first to fourth compensation codes RCD<1:4>. The set number may be adjusted to correspond to the number of counters. The first set period and the set number may be variously set depending on the embodiment.

The operation detection signal generation circuit 332, illustrated in FIG. 10, may be implemented as the same circuit as the initial detection signal generation circuit 331 and may perform the same operation as the initial detection signal generation circuit 331, except that the operation detection signal generation circuit 332 receives the first to fourth offset codes FCD<1:4> in order to set the second set period, which is greater than the first set period, of the initial detection signal generation circuit 331, and thus, a detailed description of the operation detection signal generation circuit 332 has been omitted.

The second set period may mean a period from a time at which the first internal pulse IP having a logic high level is generated to a time at which the first selection pulse SP having a logic high level is generated. The second phase difference may mean the time at which the first set signal SET is disabled to a logic low level until the level of the reference clock RCLK transitions to a logic low level for the twelfth time, that is, a set number of times. That is, the operation detection signal generation circuit 332 may generate the operation detection signal CDET having a logic high level when the first set signal SET having a logic low level is generated, when the level of the reference clock RCLK transitions to a logic low level for the twelfth time. The operation detection signal generation circuit 332 may generate the operation detection signal CDET having a logic low level when the first set signal SET having a logic high level is generated, when the level of the reference clock RCLK transitions to a logic low level for the twelfth time. The second set period may be adjusted as a logic level combination of the first to fourth offset codes FCD<1:4>. The set number may be adjusted to correspond to the number of counters. The second set period and the set number may be variously set depending on the embodiment.

Figure 14:
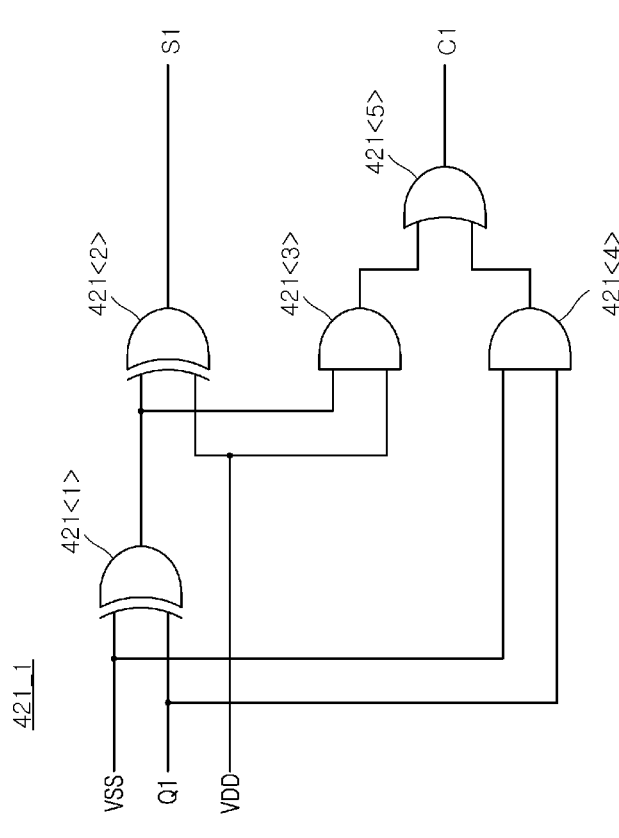
FIG. 14 is a circuit diagram illustrating a construction according to an embodiment of an adder that is included in the period setting circuit illustrated in FIG. 13.

FIG. 14 is a circuit diagram illustrating a construction according to an embodiment of the adder 421_1 that is included in the first counter 421.

The adder 421_1 may be implemented with exclusive NOR gates 421<1> and 421<2>, AND gates 421<3> and 421<4>, and an OR gate 421<5>. The adder 421_1 may generate the first sum signal S1 and the first carry signal C1 by performing an addition operation on the power source voltage VDD and the first transfer signal Q1.

For example, an operation of the first counter 421 when the level of the reference clock RCLK transitions to a logic low level for the first time and when the level of the reference clock RCLK transitions to a logic low level for the second time is described as follows.

When the level of the reference clock RCLK transitions to a logic low level for the first time, the adder 421_1 may generate the first sum signal S1 having a logic high level and the first carry signal C1 having a logic low level by performing an addition operation on the first transfer signal Q1 having a logic low level and the power source voltage VDD.

When the level of the reference clock RCLK transitions to a logic low level for the second time, the adder 421_1 may generate the first sum signal S1 having a logic low level and the first carry signal C1 having a logic high level by performing an addition operation on the first transfer signal Q1 having a logic high level and the power source voltage VDD.

That is, the first counter 421 may generate the first carry signal C1 having a logic high level whenever the level of the reference clock RCLK transitions to a logic low level for the second time by performing the addition operation.

FIG. 15 is a table for describing the first set period ($1^{st}$ SET PERIOD) and the second set period ($2^{nd}$ SET PERIOD) according to the first to fourth compensation codes RCD<1:4> and the first to fourth offset codes FCD<1:4> according to an embodiment of the present disclosure.

First, an operation of setting the first set period ($1^{st}$ SET PERIOD) based on a logic level combination of the first to fourth compensation codes RCD<1:4> is described as follows.

When the first to fourth compensation codes RCD<1:4> have a logic level combination of "0, 0, 0, 0", the first set period ($1^{st}$ SET PERIOD) may be set to 0.35 ns. A case in which the first set period ($1^{st}$ SET PERIOD) is 0.35 ns may mean a case in which a period from a time at which the first internal pulse IP having a logic high level is generated to a time at which the first selection pulse SP having a logic high level is generated is 0.35 ns.

When the first to fourth compensation codes RCD<1:4> have a logic level combination of "0, 0, 0, 1", the first set period ($1^{st}$ SET PERIOD) may be set to 0.70 ns. A case in which the first set period ($1^{st}$ SET PERIOD) is 0.70 ns may mean a case in which a period from a time at which the first internal pulse IP having a logic high level is generated to a time at which the first selection pulse SP having a logic high level is generated is 0.70 ns.

When the first to fourth compensation codes RCD<1:4> have a logic level combination of "1, 1, 1, 1", the first set period ($1^{st}$ SET PERIOD) may be set to 5.62 ns. A case in which the first set period ($1^{st}$ SET PERIOD) is 5.62 ns may mean a case in which a period from a time at which the first internal pulse IP having a logic high level is generated to a time at which the first selection pulse SP having a logic high level is generated is 5.62 ns.

As described above, the first set period ($1^{st}$ SET PERIOD) may be variously set based on a logic level combination of the first to fourth compensation codes RCD<1:4>.

Next, an operation of setting the second set period ($2^{nd}$ SET PERIOD) based on a logic level combination of the first to fourth offset codes FCD<1:4> is described as follows.

When the first to fourth offset codes FCD<1:4> have a logic level combination of "0, 0, 0, 0", the second set period ($2^{nd}$ SET PERIOD) may be set to 0.53 ns. A case in which the second set period ($2^{nd}$ SET PERIOD) is 0.53 ns may mean a case in which a period from a time at which the first internal pulse IP having a logic high level is generated to a time at which the first selection pulse SP having a logic high level is generated is 0.53 ns.

When the first to fourth offset codes FCD<1:4> have a logic level combination of "0, 0, 0, 1", the second set period ($2^{nd}$ SET PERIOD) may be set to 1.05 ns. A case in which the second set period ($2^{nd}$ SET PERIOD) is 1.05 ns may mean a case in which a period from a time at which the first internal pulse IP having a logic high level is generated to a time at which the first selection pulse SP having a logic high level is generated is 1.05 ns.

When the first to fourth offset codes FCD<1:4> have a logic level combination of "1, 1, 1, 1", the second set period ($2^{nd}$ SET PERIOD) may be set to 8.43 ns. A case in which the second set period ($2^{nd}$ SET PERIOD) is 8.43 ns may mean a case in which a period from a time at which the first internal pulse IP having a logic high level is generated to a time at which the first selection pulse SP having a logic high level is generated is 8.43 ns.

As described above, the second set period ($2^{nd}$ SET PERIOD) may be variously set based on a logic level combination of the first to fourth offset codes FCD<1:4>. In this case, the first set period ($1^{st}$ SET PERIOD) and the second set period ($2^{nd}$ SET PERIOD), according to an embodiment of the present disclosure, may be set as different time periods, and the first set period ($1^{st}$ SET PERIOD) may be set as a time period shorter than the second set period ($2^{nd}$ SET PERIOD).

FIG. 16 is a circuit diagram illustrating a construction according to an embodiment of the latch circuit 333 that is included in the phase-locked signal generation circuit 330.

The latch circuit 333 may be implemented with NOR gates 333<1> and 333<2> and an inverter 333<3>. When the initial detection signal FDET having a logic high level is generated and the operation detection signal CDET having a logic high level is generated, the latch circuit 333 may generate the phase-locked signal PLL_LK that is enabled to a logic high level. The latch circuit 333 may generate the phase-locked signal PLL_LK that is disabled to a logic low level when one of the initial detection signal FDET and the operation detection signal CDET is generated to have a logic low level.

FIGS. 17 and 18 are timing diagrams for describing an operation of the initial detection signal generation circuit 331 according to an embodiment of the present disclosure.

First, an operation of the initial detection signal generation circuit 331 is described with reference to FIG. 17. In this case, an operation of the initial detection signal generation circuit 331 when a difference between the phases of the reference clock RCLK and the feedback clock FCLK is equal to or smaller than the first phase difference during the first set period is described as follows.

At timing T11, the first signal synthesis circuit 411 of the first setting signal generation circuit 410 may generate the first internal pulse IP having a logic high level by synthesizing the first driving control signal UP having a logic low level and the second driving control signal DN having a logic high level. The first driving control signal UP may be generated to have a logic low level from timing T11 to timing T13. The second driving control signal DN may be generated to have a logic low level from timing T12 to timing T13. The first internal pulse IP may be generated to have a logic high level from timing T11 to timing T13.

The first delay circuit 412 of the first setting signal generation circuit 410 may generate the first to sixteenth delay signals D1 to D16 by sequentially delaying the first internal pulse IP.

The first to sixth counters 421 to 426 of the first period setting circuit 420 may count the number of toggles of the reference clock RCLK.

At timing T12, the first selection transfer circuit 413 of the first setting signal generation circuit 410 may generate the first selection pulse SP having a logic high level from one of the first to sixteenth delay signals D1 to D16 based on a logic level combination of the first to fourth compensation codes RCD<1:4>. Timing T11 to timing T12 may mean the first set period.

The first signal synthesis circuit 411 of the first setting signal generation circuit 410 may generate the first set signal SET having a logic low level by synthesizing the first internal pulse IP having a logic high level and the first selection pulse SP having a logic high level.

The first to sixth counters 421 to 426 of the first period setting circuit 420 may generate the sixth carry signal C6 having a logic high level when the level of the reference clock RCLK transitions for the twelfth time, that is, a set number.

The first detection signal output circuit 427 of the first period setting circuit 420 may generate the initial detection signal FDET having a logic high level because the sixth carry signal S6 having a logic high level is generated during a period in which the first set signal SET is enabled to a logic low level.

An operation of generating the operation detection signal CDET is the same as the operation of generating the initial detection signal FDET, which has described with reference to FIG. 17, and thus, a detailed description thereof has been omitted.

Next, an operation of the initial detection signal generation circuit 331 is described with reference to FIG. 18. In this case, an operation of the initial detection signal generation circuit 331 when a difference between the phases of the reference clock RCLK and the feedback clock FCLK is equal to or smaller than the first phase difference during the first set period is described as follows.

At timing T14, the first signal synthesis circuit 411 of the first setting signal generation circuit 410 may generate the first internal pulse IP having a logic high level by synthesizing the first driving control signal UP having a logic low level and the second driving control signal DN having a logic high level. The first driving control signal UP may be generated to have a logic low level from timing T14 to timing T16. The second driving control signal DN may be generated to have a logic low level from timing T15 to timing T16. The first internal pulse IP may be generated to have a logic high level from timing T14 to timing T16.

The first delay circuit 412 of the first setting signal generation circuit 410 may generate the first to sixteenth delay signals D1 to D16 by sequentially delaying the first internal pulse IP.

The first to sixth counters 421 to 426 of the first period setting circuit 420 may count the number of toggles of the reference clock RCLK.

At timing T17, the first selection transfer circuit 413 of the first setting signal generation circuit 410 may generate the first selection pulse SP having a logic high level from one of the first to sixteenth delay signals D1 to D16 based on a logic level combination of the first to fourth compensation codes RCD<1:4>. Timing T14 to timing T17 may mean the first set period.

The first signal synthesis circuit 411 of the first setting signal generation circuit 410 may generate the first set signal SET having a logic high level by synthesizing the first internal pulse IP having a logic low level and the first selection pulse SP having a logic high level.

The first to sixth counters 421 to 426 of the first period setting circuit 420 may generate the sixth carry signal C6 having a logic high level when the level of the reference clock RCLK transitions for the twelfth time, that is, a set number.

The first detection signal output circuit 427 of the first period setting circuit 420 may generate the initial detection signal FDET having a logic low level because the first set signal SET is enabled to a logic high level.

An operation of generating the operation detection signal CDET may be the same as the operation of generating the initial detection signal FDET, which has been described with reference to FIG. 18, and thus a detailed description thereof is omitted.

FIG. 19 is a timing diagram for describing an operation of the phase-locked signal generation circuit 330 according to an embodiment of the present disclosure. The operation of the phase-locked signal generation circuit 330 is described with reference to FIG. 19, but an operation of the phase-locked signal generation circuit 330 after an initial operation and the phase-locked signal is output is described as follows.

From timing T21 to timing T22, after the start of an initial operation, the initial detection signal generation circuit 331 of the phase-locked signal generation circuit 330 may set the first set period for detecting a difference between the phases of the reference clock RCLK and the feedback clock FCLK, based on the first driving control signal UP, the second driving control signal DN, and the first to fourth compensation codes RCD<1:4>. During the first set period, the initial detection signal generation circuit 331 of the phase-locked signal generation circuit 330 may generate the initial detection signal FDET having a logic high level when a difference between the phases of the reference clock RCLK and the feedback clock FCLK is equal to or smaller than the first phase difference.

After the start of the initial operation, the operation detection signal generation circuit 332 of the phase-locked signal generation circuit 330 may generate the operation detection signal CDET having a logic low level.

When the initial detection signal FDET having a logic high level is generated and the operation detection signal CDET having a logic low level is generated, the latch circuit 333 of the phase-locked signal generation circuit 330 may generate the phase-locked signal PLL_LK that is disabled to a logic low level.

From timing T23 to timing T28, after the start of the initial operation, the initial detection signal generation circuit 331 of the phase-locked signal generation circuit 330 may set the first set period for detecting a difference between the phases of the reference clock RCLK and the feedback clock FCLK, based on the first driving control signal UP, the second driving control signal DN, and the first to fourth compensation codes RCD<1:4>. During the first set period, the initial detection signal generation circuit 331 of the phase-locked signal generation circuit 330 may generate the initial detection signal FDET having a logic high level when a difference between the phases of the reference clock RCLK and the feedback clock FCLK is equal to or smaller than the first phase difference.

From timing T24 to timing T25, after the output of the phase-locked signal PLL_LK, the operation detection signal generation circuit 332 of the phase-locked signal generation circuit 330 may set the second set period based on the first driving control signal UP, the second driving control signal DN, and the first to fourth offset codes FCD<1:4>. During the second set period, the operation detection signal generation circuit 332 of the phase-locked signal generation circuit 330 may generate the operation detection signal CDET having a logic high level when a difference between the phases of the reference clock RCLK and the feedback clock FCLK is less than the second phase difference, which is greater than the first phase difference.

When the initial detection signal FDET having a logic high level is generated and the operation detection signal CDET having a logic high level is generated, the latch circuit 333 of the phase-locked signal generation circuit 330 may generate the phase-locked signal PLL_LK that is enabled to a logic high level.

From timing T25 to timing T26, after the output of the phase-locked signal PLL_LK, the operation detection signal generation circuit 332 of the phase-locked signal generation circuit 330 may set the second set period based on the first driving control signal UP, the second driving control signal DN, and the first to fourth offset codes FCD<1:4>. During the second set period, the operation detection signal generation circuit 332 of the phase-locked signal generation circuit 330 may generate the operation detection signal CDET having a logic low level when a difference between the phases of the reference clock RCLK and the feedback clock FCLK is equal to or greater than the second phase difference, which is greater than the first phase difference.

When the initial detection signal FDET having a logic high level is generated and the operation detection signal CDET having a logic low level is generated, the latch circuit 333 of the phase-locked signal generation circuit 330 may generate the phase-locked signal PLL_LK that is disabled to a logic low level.

From timing T26 to timing T27, after the output of the phase-locked signal PLL_LK, the operation detection signal generation circuit 332 of the phase-locked signal generation circuit 330 may set the second set period based on the first driving control signal UP, the second driving control signal DN, and the first to fourth offset codes FCD<1:4>. During the second set period, the operation detection signal generation circuit 332 of the phase-locked signal generation circuit 330 may generate the operation detection signal CDET having a logic high level when a difference between the phases of the reference clock RCLK and the feedback clock FCLK is less than the second phase difference, which is greater than the first phase difference.

When the initial detection signal FDET having a logic high level is generated and the operation detection signal CDET having a logic high level is generated, the latch circuit 333 of the phase-locked signal generation circuit 330 may generate the phase-locked signal PLL_LK that is enabled to a logic high level.

From timing T27 to timing T28, after the output of the phase-locked signal PLL_LK, the operation detection signal generation circuit 332 of the phase-locked signal generation circuit 330 may set the second set period based on the first driving control signal UP, the second driving control signal DN, and the first to fourth offset codes FCD<1:4>. During the second set period, the operation detection signal generation circuit 332 of the phase-locked signal generation circuit 330 may generate the operation detection signal CDET having a logic low level when a difference between the phases of the reference clock RCLK and the feedback clock FCLK is equal to or greater than the second phase difference, which is greater than the first phase difference.

When the initial detection signal FDET having a logic high level is generated and the operation detection signal CDET having a logic low level is generated, the latch circuit 333 of the phase-locked signal generation circuit 330 may generate the phase-locked signal PLL_LK that is disabled to a logic low level.

The phase-locked signal generation circuit 330, according to an embodiment of the present disclosure, can prevent the unnecessary generation of the phase-locked signal PLL_LK attributable to noise after the output of the phase-locked signal PLL_LK by setting the first set period to be short-based on the first to fourth compensation codes RCD<1:4> after the start of an initial operation, setting the second set period to be long-based on the first to fourth offset codes FCD<1:4> after the output of the phase-locked signal PLL_LK, and generating the phase-locked signal PLL_LK.

FIG. 20 is a flowchart for describing a method of adjusting a phase according to an embodiment of the present disclosure.

The method of adjusting a phase, according to an embodiment of the present disclosure, may include a phase detection step S1, an initial operation step S2, a phase-locked signal generation blocking step S3, a phase-locked signal generation step S4, and a PLL clock generation step S5.

The phase detection step S1 may be set as a step of generating the first driving control signal UP and the second driving control signal DN by detecting a difference between the phases of the reference clock RCLK and the feedback clock FCLK that are generated from the PLL clock PLL_CLK. In the phase detection step S1, the phase detection circuit 320 may generate the first driving control signal UP that is enabled when the phase of the reference clock RCLK is earlier than the phase of the feedback clock FCLK. In the phase detection step S1, the phase detection circuit 320 may generate the second driving control signal DN that is enabled when the phase of the feedback clock FCLK is earlier than the phase of the reference clock RCLK.

The initial operation step S2 may include an initial operation entry step S21, a first set period setting step S22, and an initial detection signal (FDET) generation step S23.

The initial operation entry step S21 may be set as a step of entering an initial operation.

After the start of the initial operation, the first set period setting step S22 may be set as a step of setting the first set period based on the first driving control signal UP, the second driving control signal DN, and the first to fourth compensation codes RCD<1:4>. In the first set period setting step S22, after the start of the initial operation, the initial detection signal generation circuit 331 may set the first set period for detecting a difference between the phases of the reference clock RCLK and the feedback clock FCLK based on the first driving control signal UP, the second driving control signal DN, and the first to fourth compensation codes RCD<1:4>.

During the first set period, the initial detection signal generation step S23 may be set as an operation of generating the initial detection signal FDET when a difference between the phases of the reference clock RCLK and the feedback clock FCLK is equal to or smaller than the first phase difference. In the initial detection signal generation step S23, during the first set period, the initial detection signal generation circuit 331 may generate the initial detection signal FDET that is enabled to a logic high level when a difference between the phases of the reference clock RCLK and the feedback clock FCLK is equal to or smaller than the first phase difference and may generate the initial detection signal FDET that is disabled to a logic low level when a difference between the phases of the reference clock RCLK and the feedback clock FCLK is greater than the first phase difference. After the initial detection signal generation step S23 is performed, the phase-locked signal generation step S4 may be performed.

During the first set period, the initial operation step S2 may be set as an operation of setting the first set period based on the first driving control signal UP, the second driving control signal DN, and the first to fourth compensation codes RCD<1:4> after the start of the initial operation and generating the initial detection signal FDET based on a difference between the phases of the reference clock RCLK and the feedback clock FCLK. In the initial operation step S2, after the start of the initial operation, the initial detection signal FDET that is enabled when a difference between the phases of the reference clock RCLK and the feedback clock FCLK is equal to or smaller than the first phase difference during the first set period may be generated. In the initial operation step S2, after the start of the initial operation, the initial detection signal FDET that is disabled when a difference between the phases of the reference clock RCLK and the feedback clock FCLK is greater than the first phase difference during the first set period may be generated.

The phase-locked signal control step S3 may include a second set period setting step S31 and an operation detection signal generation step S32.

After the output of the phase-locked signal PLL_LK, the second set period setting step S31 may be set as a step of setting the second set period based on the first driving control signal UP, the second driving control signal DN, and the first to fourth offset codes FCD<1:4>. In the second set period setting step S31, after the output of the phase-locked signal PLL_LK, the operation detection signal generation circuit 332 may set the second set period based on the first driving control signal UP, the second driving control signal DN, and the first to fourth offset codes FCD<1:4>.

During the second set period, the operation detection signal generation step S32 may be set as a step of generating the operation detection signal CDET when a difference between the phases of the reference clock RCLK and the feedback clock FCLK is less than the second phase difference, which is greater than the first phase difference. In the operation detection signal generation step S32, during the second set period, the operation detection signal generation circuit 332 may generate the operation detection signal CDET that is enabled to a logic high level when a difference between the phases of the reference clock RCLK and the feedback clock FCLK is less than the second phase difference, which is greater than the first phase difference, and may generate the operation detection signal CDET that is disabled to a logic low level when a difference between the phases of the reference clock RCLK and the feedback clock FCLK is equal to or greater than the second phase difference, which is greater than the first phase difference. After the operation detection signal generation step S32 is performed, the phase-locked signal generation step S4 may be performed.

The phase-locked signal control step S3 may be set as a step of setting the second set period based on the first driving control signal UP, the second driving control signal DN, and the first to fourth offset codes FCD<1:4> after the output of the phase-locked signal PLL_LK and generating the operation detection signal CDET based on a difference between the phases of the reference clock RCLK and the feedback clock FCLK during the second set period. In the phase-locked signal control step S3, after the output of the phase-locked signal PLL_LK, the operation detection signal CDET that is enabled to a logic high level when a difference between the phases of the reference clock RCLK and the feedback clock FCLK is less than the second phase difference, which is greater than the first phase difference, during the second set period may be generated. In the phase-locked signal control step S3, after the output of the phase-locked signal PLL_LK, the operation detection signal CDET that is disabled to a logic low level when a difference between the phases of the reference clock RCLK and the feedback clock FCLK is equal to or greater than the second phase difference, which is greater than the first phase difference, during the second set period may be generated.

The phase-locked signal generation step S4 may be set as a step of generating the phase-locked signal PLL_LK based on the initial detection signal FDET and the operation detection signal CDET. In the phase-locked signal generation step S4, the latch circuit 333 may generate the phase-locked signal PLL_LK based on the initial detection signal FDET and the operation detection signal CDET. The latch circuit 333 may generate the phase-locked signal PLL_LK that is enabled to a logic high level when both the initial detection signal FDET and the operation detection signal CDET are enabled to a logic high level. The latch circuit 333 may stop the generation of the phase-locked signal PLL_LK when one of the initial detection signal FDET and the operation detection signal CDET is disabled to a logic low level.

The PLL clock generation step S5 may be set as a step of generating the PLL clock PLL_CLK. In the PLL clock generation step S5, the PLL circuit 300 may generate the PLL clock PLL_CLK so that the phase of the PLL clock PLL_CLK is generated within a target period. The PLL circuit 300 may adjust the phase of the PLL clock PLL_CLK so that a difference between the phases of the reference clock RCLK and the feedback clock FCLK that are generated from the PLL clock PLL_CLK is smaller than the first phase difference. When the PLL clock generation step S5 is terminated, the phase detection step S1 may be entered again.

The method of adjusting a phase, according to an embodiment of the present disclosure, can prevent the unnecessary generation of the phase-locked signal PLL_LK attributable to a jitter change and noise by setting the first set period to be short based on the first to fourth compensation codes RCD<1:4> after the start of an initial operation, setting the second set period to be long based on the first to fourth offset codes FCD<1:4>, and generating the phase-locked signal PLL_LK. FIG. 21 is a block diagram illustrating a construction according to an embodiment of an electronic system 1000 according to an embodiment of the present disclosure. As illustrated in FIG. 21, the electronic system 1000 may include a host 1100 and a semiconductor system 1200.

The host 1100 and the semiconductor system 1200 may mutually transmit signals by using an interface protocol. The interface protocol that is used between the host 1100, and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) so that the semiconductor devices 1400(K:1) perform a write operation and a read operation. Each of the semiconductor devices 1400(K:1) can prevent the unnecessary generation of the phase-locked signal attributable to a jitter and noise by setting the first set period to be short based on the compensation codes after the start of an initial operation, setting the second set period to be long based on the offset codes, and generating the phase-locked signal.

The controller 1300 may be implemented as the controller 10 illustrated in FIG. 1. Each of the semiconductor devices 1400(K:1) may be implemented as the electronic device 20, illustrated in FIG. 2. According to an embodiment, each of the semiconductor devices 1400(K:1) may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. An electronic device comprising:
   a phase detection circuit configured to detect a difference between phases of a reference clock and a feedback clock; and
   a phase-locked signal generation circuit configured to generate a phase-locked signal based on results of the detection of the difference between the phases of the reference clock and the feedback clock,
   wherein the phase-locked signal generation circuit is configured to:
      set a first set period based on a compensation code and generate the phase-locked signal when the difference between the phases of the reference clock and the feedback clock is equal to or smaller than a first phase difference during the first set period after a start of an initial operation, and
      stop the generation of the phase-locked signal when the difference between the phases of the reference clock and the feedback clock is equal to or greater than a second phase difference, which is greater than the first phase difference, after outputting the phase-locked signal.

2. The electronic device of claim 1, wherein the phase-locked signal generation circuit is configured to generate the phase-locked signal based on the difference between the phases of the reference clock and the feedback clock during the first set period and during a second set period, and
   wherein the first set period and the second set period are set as different time periods,
   wherein the first set period is set to be shorter than the second set period.

3. The electronic device of claim 1, wherein the phase detection circuit is configured to generate first and second driving control signals by detecting the difference between the phases of the reference clock and the feedback clock.

4. The electronic device of claim 3,
   wherein the phase detection circuit is configured to generate the first driving control signal that is enabled when a phase of the reference clock is earlier than a phase of the feedback clock, and
   wherein the phase detection circuit is configured to generate the second driving control signal that is enabled when the phase of the feedback clock is earlier than the phase of the reference clock.

5. The electronic device of claim 3, wherein the phase detection circuit comprises:
   a reference clock phase control circuit configured to:
      generate the first driving control signal that is enabled when a level of the reference clock transitions from a first logic level to a second logic level and disabled when a reset signal is enabled, and
      generate a reference setting signal and a first pre-driving control signal that are enabled when the reference clock transitions from the first logic level to the second logic level;
   a feedback clock phase control circuit configured to:
      generate the second driving control signal that is enabled when the feedback clock transitions from the first logic level to the second logic level and disabled when the reset signal is enabled, and
      generate a feedback setting signal and a second pre-driving control signal that are enabled when the feedback clock transitions from the first logic level to the second logic level; and
   a reset signal generation circuit configured to generate the reset signal that is enabled when all of the reference setting signal, the first pre-driving control signal, the feedback setting signal, and the second pre-driving control signal are enabled.

6. The electronic device of claim 5, wherein the reference clock phase control circuit comprises:
   a first driving control signal generation circuit configured to:
      generate the reference setting signal that is enabled when the reference clock transitions from the first logic level to the second logic level, and
      generate the first driving control signal that is enabled when both the reference setting signal and the first pre-driving control signal are enabled during a period in which the reset signal is disabled; and
   a first pre-driving control signal generation circuit configured to generate the first pre-driving control signal that is enabled when the reference setting signal is disabled and disabled when the reset signal is enabled.

7. The electronic device of claim 5, wherein the feedback clock phase control circuit comprises:
   a second driving control signal generation circuit configured to:

generate the feedback setting signal that is enabled when the feedback clock transitions from the first logic level to the second logic level, and generate the second driving control signal that is enabled when both the feedback setting signal and the second pre-driving control signal are enabled during a period in which the reset signal is disabled; and a second pre-driving control signal generation circuit configured to generate the second pre-driving control signal that is enabled when the feedback setting signal is disabled and disabled when the reset signal is enabled.

8. The electronic device of claim 1, wherein the phase-locked signal generation circuit comprises:

an initial detection signal generation circuit configured to:

set the first set period based on first and second driving control signals and the compensation code after the start of the initial operation, and generate an initial detection signal based on the difference between the phases of the reference clock and the feedback clock during the first set period;

an operation detection signal generation circuit configured to:

set a second set period based on the first and second driving control signals and an offset code after outputting the phase-locked signal, and generate an operation detection signal based on the difference between the phases of the reference clock and the feedback clock during the second set period; and a latch circuit configured to generate the phase-locked signal based on the initial detection signal and the operation detection signal.

9. The electronic device of claim 8, wherein the compensation code is a signal that is input from an external device to set the first set period for detecting the difference between the phases of the reference clock and the feedback clock, and wherein the offset code is a signal that is input from the external device to set the second set period for detecting the difference between the phases of the reference clock and the feedback clock.

10. The electronic device of claim 8, wherein the initial detection signal generation circuit comprises:

a first setting signal generation circuit configured to:

generate a first internal pulse by synthesizing the first and second driving control signals, and generate a first selection pulse that is generated by delaying the first internal pulse by the first set period based on the compensation code and a first set signal based on the first internal pulse; and a first period setting circuit configured to generate the initial detection signal in response to the first set signal when the reference clock is toggled a first set number of times.

11. The electronic device of claim 10, wherein the first setting signal generation circuit comprises:

a first signal synthesis circuit configured to generate the first internal pulse by synthesizing the first and second driving control signals and configured to generate the first set signal by synthesizing the first internal pulse and the first selection pulse;

a first delay circuit configured to generate first to fourth delay signals that are sequentially enabled by delaying the first internal pulse; and a first selection transfer circuit configured to output one of the first to fourth delay signals as the first selection pulse based on the compensation code.

12. The electronic device of claim 10, wherein the first period setting circuit comprises:

a first group of counters comprising multiple counters and configured to count the reference clock through the multiple counters and configured to generate a first carry signal that is enabled when the reference clock is toggled the first set number of times; and a first detection signal output circuit configured to, when the first carry signal is generated, generate the initial detection signal that is enabled when the first set signal is disabled and disabled when the first set signal is enabled.

13. The electronic device of claim 8, wherein the operation detection signal generation circuit comprises:

a second setting signal generation circuit configured to generate a second internal pulse by synthesizing the first and second driving control signals and configured to generate a second selection pulse that is generated by delaying the second internal pulse by the second set period based on the offset code and a second set signal based on the second internal pulse; and a second period setting circuit configured to generate the operation detection signal based on the second set signal when the reference clock is toggled a second set number of times.

14. The electronic device of claim 13, wherein the second setting signal generation circuit comprises:

a second signal synthesis circuit configured to generate the second internal pulse by synthesizing the first and second driving control signals and configured to generate the second set signal by synthesizing the second internal pulse and the second selection pulse;

a second delay circuit configured to generate fifth to eighth delay signals that are sequentially enabled by delaying the second internal pulse; and a second selection transfer circuit configured to output one of the fifth to eighth delay signals as the second selection pulse based on the offset code.

15. The electronic device of claim 13, wherein the second period setting circuit comprises:

a second group of counters comprising multiple counters and configured to count the reference clock through the multiple counters and configured to generate a second carry signal that is enabled when the reference clock is toggled the second set number of times; and a second detection signal output circuit configured to, when the second carry signal is generated, generate the operation detection signal that is enabled when the second set signal is disabled and disabled when the second set signal is enabled.

16. An electronic device comprising:

an initial detection signal generation circuit configured to set a first set period based on a compensation code and generate an initial detection signal when a difference between phases of a reference clock and a feedback clock is equal to or smaller than a first phase difference during the first set period after a start of an initial operation;

an operation detection signal generation circuit configured to stop a generation of an operation detection signal when the difference between the phases of the reference clock and the feedback clock is equal to or greater than a second phase difference, which is greater than the first phase difference, after outputting a phase-locked signal; and a latch circuit configured to generate the phase-locked signal based on the initial detection signal and the operation detection signal.

17. The electronic device of claim 16, wherein the latch circuit is electrically connected to the initial detection signal generation circuit directly and configured to receive the initial detection signal electrically connected to the operation detection signal generation circuit directly and configured to receive the operation detection signal.

18. The electronic device of claim 16, wherein the initial detection signal generation circuit is configured to:

set the first set period based on first and second driving control signals that are generated based on the difference between the phases of the reference clock and the feedback clock and the compensation code after the start of the initial operation, and generate the initial detection signal based on the difference between the phases of the reference clock and the feedback clock during the first set period.

19. The electronic device of claim 16, wherein the operation detection signal generation circuit is configured to:

set a second set period, which is greater than the first set period, based on first and second driving control signals that are generated based on the difference between the phases of the reference clock and the feedback clock and an offset code after outputting the phase-locked signal, and generate the operation detection signal based on the difference between the phases of the reference clock and the feedback clock during the second set period.

20. The electronic device of claim 19, wherein the offset code is a signal that is input from an external device to set the second set period for detecting the difference between the phases of the reference clock and the feedback clock.

\* \* \* \* \*